United States Patent [19]
Minne et al.

[11] Patent Number: 5,883,705
[45] Date of Patent: Mar. 16, 1999

[54] ATOMIC FORCE MICROSCOPE FOR HIGH SPEED IMAGING INCLUDING INTEGRAL ACTUATOR AND SENSOR

[75] Inventors: Stephen Charles Minne, Danville, Ill.; Calvin F. Quate; Scott Manalis, both of Stanford, Calif.

[73] Assignee: The Board of Trustees of the Leland Stanford, Jr. University, Stanford, Calif.

[21] Appl. No.: 558,563

[22] Filed: Oct. 31, 1995

Related U.S. Application Data

[63] Continuation-in-part of Ser. No. 519,108, Aug. 25, 1995, which is a continuation-in-part of Ser. No. 296,340, Aug. 25, 1994, abandoned, which is a continuation-in-part of Ser. No. 226,784, Apr. 12, 1994, Pat. No. 5,517,280.

[51] Int. Cl.$^6$ .................................................. G01B 5/28
[52] U.S. Cl. .................... 355/71; 355/67; 355/53; 73/105; 250/234; 250/306; 438/703
[58] Field of Search ................... 355/53, 67, 71; 250/234, 306; 354/227.1; 73/105; 438/703

[56] References Cited

U.S. PATENT DOCUMENTS

| | | | |
|---|---|---|---|
| 4,479,831 | 10/1984 | Sandow et al. | 148/1.5 |
| 4,724,318 | 2/1988 | Binning | 250/306 |
| 5,138,174 | 8/1992 | Tang | 250/492.3 |
| 5,209,117 | 5/1993 | Bennett | 73/517 R |
| 5,210,410 | 5/1993 | Barrett | 250/234 |
| 5,221,415 | 6/1993 | Albrecht et al. | 156/629 |
| 5,227,626 | 7/1993 | Okada et al. | 250/234 |
| 5,231,286 | 7/1993 | Kajimura et al. | 250/234 |
| 5,254,854 | 10/1993 | Betzig | 250/234 |
| 5,345,815 | 9/1994 | Albrecht et al. | 73/105 |
| 5,354,985 | 10/1994 | Quate | 250/234 |
| 5,406,832 | 4/1995 | Gamble et al. | 73/105 |
| 5,444,244 | 8/1995 | Kirk et al. | 250/306 |
| 5,537,863 | 7/1996 | Fujiu et al. | 73/105 |
| 5,618,760 | 4/1997 | Soh et al. | 438/703 |

FOREIGN PATENT DOCUMENTS

| | | | |
|---|---|---|---|
| 1504-485-A | 8/1989 | U.S.S.R. | G01B 5/28 |
| WO 94/29894 | 12/1994 | WIPO | H01J 37/00 |

OTHER PUBLICATIONS

"Intergrated optics and new wave phenomena in optical waveguides", P.K. Tien, Reviews of Modern Physics, vol. 49, No. 2, Apr. 1977, pp. 361–362.

"Integrated Acoustooptic Circuits and Applications", Chen S. Tsai, IEEE Transactions on Ultrasonics, Ferroelectrics and Frequency Control, vol. 39, No. 5, Sep. 1992, pp. 529–554.

"Guided–Wave Acousto–Optics Interactions, Devices and Applications", Chen S. Tsai (Ed.), Springer–Verlag, 1990, pp. 79 and 250–256.

"Near–field subwavelength micropattern generation: Pipette guided argon fluoride excimer laser microfabrication", M. Rudman et al., J. Appl. Phys. 72(9), 1 Nov. 1992, pp. 4379–4383.

(List continued on next page.)

*Primary Examiner*—Safet Metjahic
*Assistant Examiner*—Daniel P. Malley
*Attorney, Agent, or Firm*—Skjerven, Morrill, MacPherson, Franklin & Friel; David E. Steuber

[57] ABSTRACT

A cantilever for a scanning probe microscope (SPM) includes a piezoelectric element in a thicker, less flexible section near the fixed base of the cantilever and a piezoresistor in a thinner, more flexible section near the free end of the cantilever. When the SPM operates in the constant force mode, the piezoelectric element is used to control the tip-sample separation. Since the resonant frequency of the piezoelectric element is substantially higher than that of conventional piezoelectric tube scanners, much higher scan rates can be achieved. When the SPM operates in the dynamic or intermittent contact mode, a superimposed AD-DC signal is applied to the piezoelectric element, and the latter is used to vibrate the cantilever as well as to control the tip-sample spacing. In another embodiment the cantilever is supported on a knife edge and vibrates at a third or higher order resonant frequency.

12 Claims, 17 Drawing Sheets

OTHER PUBLICATIONS

"Optical characteristics of 0.1μm circular apertures in a metal film as light sources for scanning ultramicroscopy", U.Ch. Fischer, J. Vac. Sci. Technol. B 3(1), Jan./Feb. 1985, pp. 386–390.

"Near–field optical microscope using a silicon–nitride probe", N.F. van Hulst et al., Appl. Phys. Lett. 62(5), 1 Feb. 1993, pp. 461–463.

"Near–fild optical scanning microscopy in reflection", U. Ch. Fischer, Appl. Phys. Lett. 52(4), 25 Jan. 1988, pp. 249–251.

"Micron–Size Optical Waveguide for Optoelectronic Integrated Circuits", T. Nagata et al., Extended Abstracts of the 1993 International Conference on Solid State Devices and Materials, Makuhari, 1993, pp. 1047–1049.

"A Light Source Smaller Than the Optical Wavelength", K. Lieberman et al., Science, vol. 247, 5 Jan. 1990, pp. 59–61.

"Near–field differential scanning optical microscope with atomic force regulation", R. Toledo–Crow et al., Appl. Phys. Lett. 60(24), 15 Jun. 1992, pp. 2957–2959.

"Near–Field Optics: Microscopy, Spectroscopy, and Surface Modification Beyond the Diffraction Limit", Eric Betzig et al., Science vol. 257, 10 Jul. 1992, pp. 189–195.

"Breaking the Diffraction Barrier: Optical Microscopy on a Nanometric Scale", E. Betzig et al., Science vol. 251, 22 Mar. 1991, pp. 1468–1470.

"Combined shear force and near–field scanning optical microscopy", E. Betzig et al., Appl. Phys. Lett. 60(20), 18 May 1992, pp. 2484–2486.

N. Barniol et al., "Modification of HF–Treated Silicon (100) Surfaces by Scanning Tunneling Microscopy in Air Under Imaging Conditions", Appl. Phys. Lett., vol. 61, No. 4, 27 Jul. 1992, 1992 American Institute of Physics, pp. 462–464.

J.A. Dagata et al., "Modification of Hydrogen–Passivated Silicon By A Scanning Tunneling Microscope Operating in Air", Appl. Phys. Lett., vol. 56, No. 20, 14 May 1990, pp. 2001–2003.

J.A. Dagata et al., Pattern Generation on Semiconductor Surfaes by a Scanning Tunneling Microscope Operating in Air, J. Vac. Sci. Technol. B, vol. 9, No. 2, Mar./Apr. 1991, pp. 1384–1388.

Sugimara, et al., "Maskless Patterning of Silicon Surface Based on Scanning Tunneling Microscope Tip–Induced Anodization and Chemical Etching", Appl. Phys. Lett., vol. 65, No. 12, 19 Sep. 1994, pp. 1569–1571.

Wang et al., "Nanometer–Structure Writing On SI(100) Surfaces Using a Non–Contract–Mode Atomic Force Microscope", Appl. Phys. Lett., vol. 65, No. 11, 12 Sep. 1994, pp. 1415–1417.

Wolf et al., "Silicon Processing For The VLSI Era Vol. 1: Process Technology", Lattice Press, 1986, pp. 209–210.

"Thermomechanical writing with an atomic force microscope tip", H.J. Mamin et al., Appl. Phys. Lett. 61(8), 24 Aug. 1992, pp. 1003–1005.

"The atomic force microscope used as a powerful tool for machining surfaces", T.A. Jung et al., Elsevier Science Publishers, 1992, pp. 1446–1451.

"25 nm chromium oxide lines by scanning tunneling lithography in air", H.J, Song et al., 38th Int'l Symp. on Electron, Ion and Photon Beams, New Orleans, LA, May 31–Jun. 3, 1994, pp. 16 pgs.

"Nanometer–scale lithography using the atomic force microscope", A. Majumdar et al., Appl. Phys. Lett. 61(19), 9 Nov. 1992, pp. 2293–2295.

"Tip–induced anodization of titanium surfaes by scanning tunneling microscopy: A humidity effect on nanolithography", H. Sugimuar et al., Appl. Phys. Lett. 62(9), 30 Aug. 1993, pp. 1288–1290.

"Nanometer scale patterning of silicon (100) surfaces by an atomic force microscope operating in air", L. Tsau et al., Appl. Phys. Lett. 64(16), 18 Apr. 1994, pp. 2133–2135.

"Fabrication of Si nanstructures with an atomic force microscope", E.S. Snow et al., Appl. Phys. Lett. 64(15), 11 Apr. 1994, pp. 1932–1934.

"Lithographic patterning of self–assembled films", J.M. Calvert, J. Vac. Sci. Technol. B 11(6), Nov./Dec. 1993, pp. 2155–2163.

"Self–assembled monolayer electron beam resist on GaAs", R.C. Tiberio et al., Appl. Phys. Lett. 62(5), 1 Feb. 1993, pp. 476–478.

"Low voltage electron beam lighography in self–assembled ultrathin films with the scanning tunneling microscope", C.R.K. Marrian et al, Appl. Phys. Lett. 64(3), 17 Jan. 1994, pp. 390–392.

"Scanning Probe Lithography. 1. Scanning Tunneling Microscope Induced Lithography of Self–Assembled n–Alkanethiol Monolayer Resists", C.B. Ross et al., American Chemical Society, Langmuir, vol. 9, No. 3, 1993, pp. 632–636.

"Modification of Silicon Surface Produced by Electric Field Enhanced Oxidation Through Native Oxide", Y. Ejiri et al., Extended Abstracts of 1993 Int'l Conf. on Solid State Devices and Materials, 1993, pp. 606–608.

"Fabrication of silicon nanostructures with a scanning tunneling microscope", E.S. Snow et al., Appl. Phys. Lett. 63(6), 9 Aug. 1993, pp. 749–751.

"Nanometre–scale chemical modification using a scanning tunnelling microscope", Y. Utsugi, Nippon Telegraph and Telephone Corp., LSI Laboratories, undated, 2 pgs.

"Atomic Force Microscopy Using A Piezoresistive Cantilever", M. Tortonese et al., IEEE, Mar. 1991, pp. 448–450.

"Fabrication of Si nanostructures with an atomic force microscope", E.S. Snow et al., Appl. Phys. Lett. 64(15), 11 Apr. 1994, 12 pgs.

"Applications of Atomic Force Microscopy for Nanolighography", P.I. Oden et al., undated, 7 pgs.

*Technology of proximal probe ligthography*, "Principles and Techniques of STM Lithography", M.A. McCord et al, 1993, The Society of Photo–Optical Instrumentation Engineers, pp. 16–32.

*Technology of proximal probe lithography*, "Low Voltage E–Beam Lithography with The STM", C.R.K. Marrian et al, 1993, The Society of Photo–Optical Instrumentation Engineers, pp. 58–73.

*Technology of proximal probe lithography*, "The Technology of Proximal Probe Lithography: An Overview", J.A. Dagata et al, 1993, The Society of Photo–Optical Instrumentation Engineers, pp. 3–11.

"Nanometer Lithography on Silicon and Hydrogenated Amouphous Silicon with Low Energy Electrons", Kramer et al., abstract, International Conference on Micro and Nanofabrication, Sep. 1994.

N. Kramer et al., "Fabrication of Metallic Nanowires with a Scanning Tunneling Microscope", 1995 American Institute of Physics, Appl. Phys. Lett. 66 (11), 13 Mar. 1995, 1325–1327.

"Silicon transfer layer for multilayer resist systems", J.B. Kruger et al., J. Vac. Sci. Technol., 19(4), Nov./Dec. 1991, pp. 1320–1324.

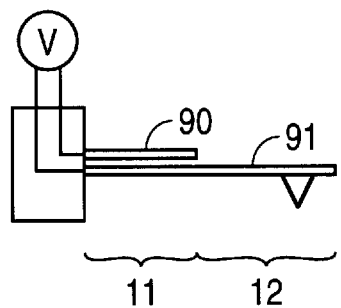
FIG. 14
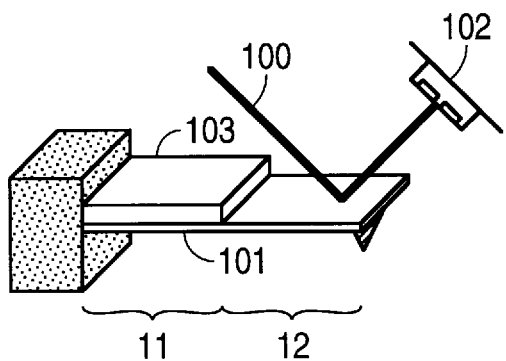 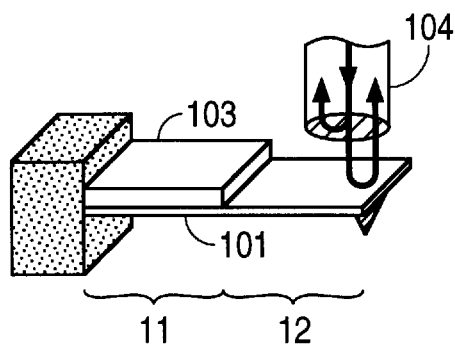
FIG. 15A　　　　　　FIG. 15B
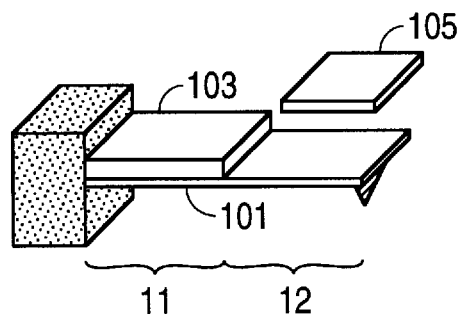
FIG. 15C

ATOMIC FORCE MICROSCOPE FOR HIGH SPEED IMAGING INCLUDING INTEGRAL ACTUATOR AND SENSOR

RELATED APPLICATIONS

This application is a continuation-in-part of application Ser. No. 08/519,108, filed Aug. 25, 1995, which is a continuation-in-part of application Ser. No. 08/296,340, filed Aug. 25, 1994, now abandoned, which is a continuation-in-part of application Ser. No. 08/226,784, filed Apr. 12, 1994, now U.S. Pat. No. 5,517,280, issued May 14, 1996, each of which is incorporated herein by reference in its entirety.

FIELD OF THE INVENTION

This invention relates to scanning probe microscopes and in particular to a cantilever used in scanning probe microscopes.

BACKGROUND OF THE INVENTION

Scanning probe microscopes operate by scanning a probe over a surface that is to be examined, typically in a raster pattern. One type of scanning probe microscope is an atomic force microscope, in which the probe consists of a cantilever with a sharp tip located near its free end. As the cantilever is scanned, the tip interacts with the surface. This in turn causes physical changes in the cantilever which are detected and used to generate a representation of the surface, often down to an atomic scale. Other types of scanning probe microscopes include magnetic force microscopes and electric force microscopes, which detect phenomena other than the topography of a sample.

An atomic force microscope can operate in several modes. In the "contact" or "constant force" mode, the tip is maintained in contact with the surface. As the tip encounters topographical features of the surface, the cantilever is deflected or bent. These deflections are detected, and by means of a feedback system the distance between the cantilever and the surface is controlled so as to maintain a constant force between the tip and the surface. In the feedback system, a signal representative of the deflection of the cantilever is compared against a reference voltage to produce an error signal. Using the feedback electronics to hold the error signal to zero, an output is generated which both holds the error signal to zero by changing the tip-sample spacing, and generates a representation of the surface.

In the "dynamic" or "non-contact" mode the tip is brought very close to the surface, and the cantilever is vibrated at a frequency which is close to its resonant frequency. As the cantilever is scanned, the distance between the tip and the features of the surface varies. This in turn causes the gradient of the Van der Waals and other forces between the tip and the surface to change. Resulting changes in the vibrational amplitude, frequency or phase of the cantilever are detected, and again the distance between the cantilever and the surface is controlled by a feedback system to maintain the tip-sample separation at a constant.

The "cyclical" or "intermittent" contact mode, described in U.S. Pat. Nos. 5,266,801 and 5,308,974, is somewhat similar to the dynamic mode, but the tip is allowed to strike the surface as the cantilever vibrates.

The separation between the cantilever and the sample surface is normally controlled by means of a piezoelectric tube on which the sample platform is mounted. The piezoelectric tube is part of the feedback system mentioned above. The output of the cantilever deflection detector is delivered to an input of the piezoelectric tube via the feedback electronics. Variations in this signal cause the tube to expand or contract along its axis and thereby adjust the position of the sample in relation to the cantilever in a direction normal to the surface of the sample. Alternatively, the cantilever can be mounted on the piezoelectric tube.

The ability of an atomic force microscope to generate images rapidly depends on the speed at which the cantilever is scanned over the sample. Typical scan speeds are in the range of 10 to 100 $\mu$m/sec, which means that images take several minutes to generate. At speeds greater than this level, the cantilever, as it interacts with features on the sample surface, begins to interact at frequencies that approach the resonant frequency of the piezoelectric tube (typically between 2 and 10 kHz). When the piezoelectric tube moves into resonance, the feedback system used to maintain a constant tip-sample force (or spacing, if the microscope is operating in the dynamic mode) does not function properly.

By using the principles of this invention, the scan speed attainable by the cantilever can be significantly increased.

SUMMARY OF THE INVENTION

The cantilever of this invention is for use in a scanning probe microscope. The scanning probe microscope also includes a scanner for scanning the sample and a feedback system for controlling the separation between the tip and the sample.

The cantilever of this invention comprises two sections: an actuator section, which includes an actuator and is located relatively near the fixed base of the cantilever; and a bending section, which is associated with a deflection detector and is located relatively near the free end (tip) of the cantilever. The actuator controls the position of the tip relative to the sample. The deflection detector detects the deflection of the cantilever.

In most embodiments, the actuator section is relatively stiff and thick as compared to the bending section. As a result, the actuator section does not bend appreciably under the influence of a force on the tip. This creates an efficient coupling of any deflection of the cantilever into the bending section. Moreover, the relatively stiff actuator section can bend or move the bending section with little difficulty.

In the preferred embodiment, the actuator comprises a piezoelectric element, and the deflection detector comprises a piezoresistor which is integral to the bending section. In other embodiments, the actuator section may include, for example, a capacitive plate, and the deflection detector may include, for example, an optical detector, an interferometric detector or a capacitive detector.

When the microscope operates in the dynamic or intermittent contact modes, the actuator is used to vibrate the cantilever as well as to control the tip-sample separation. In the preferred embodiment, this is accomplished by applying an oscillatory signal to one of the electrodes of the actuator while applying a DC signal that is controlled by the output of the deflection detector to the other electrode.

In the preferred embodiment, the cantilever is formed of silicon, and the piezoelectric element comprises an electrode/ZnO/electrode sandwich which is attached to the silicon cantilever. A portion of the silicon adjacent the piezoelectric element is heavily doped with impurities and forms a conductive region which is part of the circuit which includes the piezoresistor. In accordance with another aspect of the invention, circuitry is provided for adjusting for stress that is induced in the heavily-doped silicon as a result of the expansion and contraction of the piezoelectric element. Circuitry is also provided for adjusting for currents that are induced in the conductive region by the current flowing through the piezoelectric element. These corrections are provided by properly calibrated amplifiers whose respective outputs are added into the feedback system.

Yet another aspect of this invention yields an additional technique for correcting for the electrical coupling between the piezoelectric element and the piezoresistor. An AC signal having a frequency substantially above the imaging bandwidth is applied to the piezoresistor, and the output of the piezoresistor is delivered to a lock-in amplifier, which effectively demodulates the AC signal and provides an output representative of the deflection of the cantilever. Any spurious signals which are created by the electrical coupling between the piezoelectric element and the piezoresistor will be at frequencies which are well below the AC signal and will therefore be ignored by the lock-in amplifier. Alternatively, a conductive shield layer may be used to prevent signals applied to the piezoelectric element from being coupled to the piezoresistor.

Because the resonant frequency of the piezoelectric element is significantly greater than the resonant frequency of a typical piezoelectric tube, the scan speed of the cantilever may be significantly increased.

In accordance with another aspect of the invention, a cantilever is supported on a knife edge structure and is vibrated at a higher mode of resonance. The actuator used to vibrate the cantilever could be piezoelectric or capacitive, for example. This arrangement facilitates faster scanning rates.

BRIEF DESCRIPTION OF THE DRAWING

The principles of this invention will be better understood by reference to the following figures of the drawing, in which like reference numerals are used to designate similar elements.

FIG. 14 illustrates a capacitive actuator in an alternative embodiment of the invention.

FIG. 15A illustrates an optical deflection detector in an alternative embodiment of the invention.

FIG. 15B illustrates an interferometric deflection detector in an alternative embodiment of the invention.

FIG. 15C illustrates a capacitive deflection detector in an alternative embodiment of the invention.

DESCRIPTION OF THE INVENTION

Figure 1A:
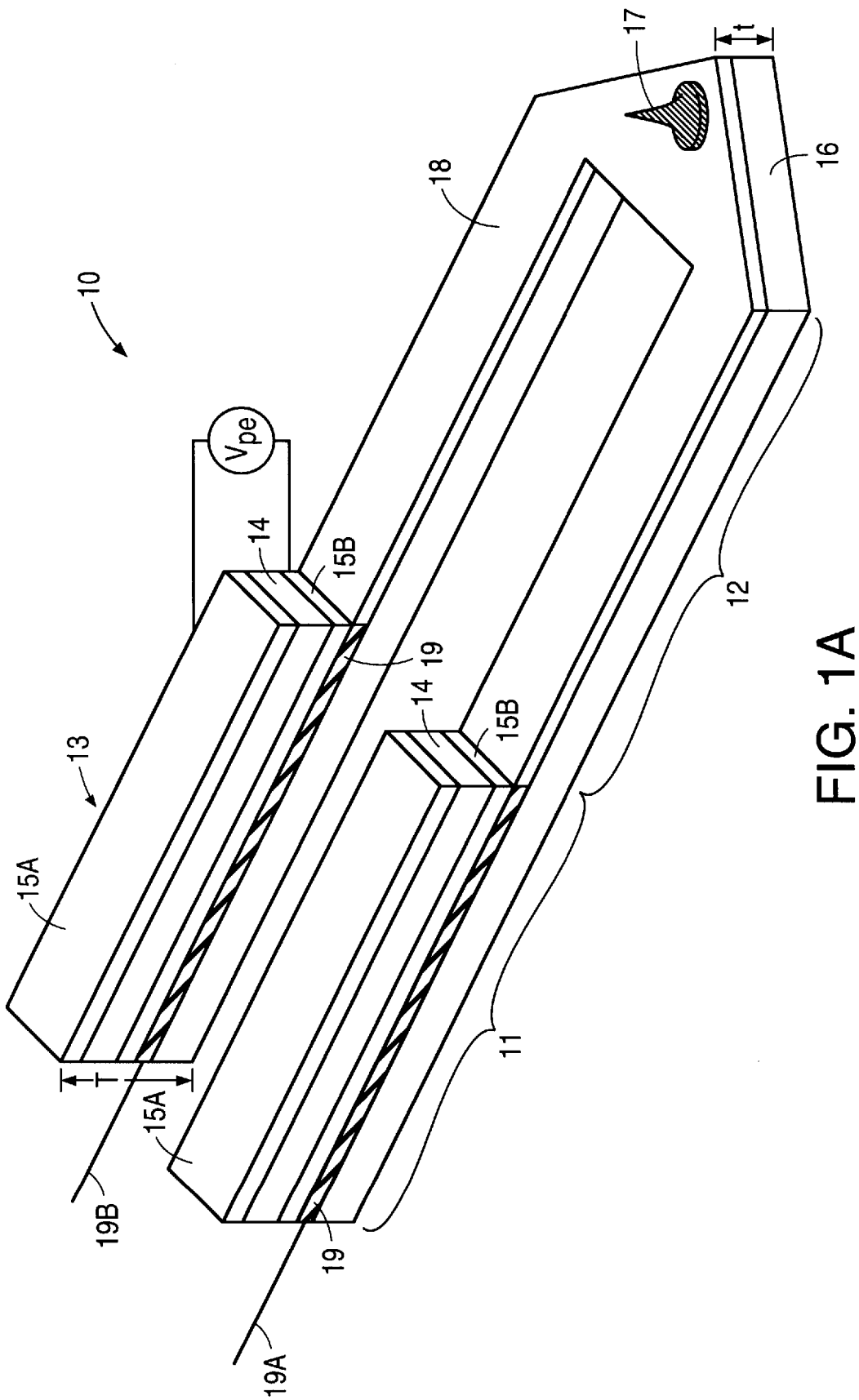
FIG. 1A illustrates a perspective view of a cantilever representative of a first embodiment in accordance with the invention.

A cantilever according to one aspect of this invention includes two sections: an actuator section located relatively near the base of the cantilever and a bending section located relatively near the tip of the cantilever. FIG. 1A shows a cantilever 10 which includes a relatively thick actuator section 11 and a relatively thin bending section 12. Actuator section 11 is defined by a piezoelectric element 13, which comprises a zinc oxide layer 14 sandwiched between metal electrodes 15A and 15B. Alternatively, lead zirconate titinate (PZT) could be used instead of zinc oxide. As is apparent from FIG. 1A, in this embodiment cantilever 10 is U-shaped, and piezoelectric element 13 is therefore split into two parts which are attached to the legs of the cantilever, respectively. In other embodiments, the cantilever is solid and the piezoresistor and associated circuit elements are formed by patterned implantations.

Cantilever 10 is preferably formed on a silicon substrate 16 and includes a tip 17. In bending section 12, a layer of the silicon is lightly-doped (e.g., at $10^{18}$ cm$^{-3}$) to form a piezoresistive element 18. The silicon underlying piezoelectric element 13 is more heavily doped (e.g., at $10^{20}$ cm$^{-3}$) to form a conductive region 19 which adjoins piezoresistive element 18. The circuit which includes piezoresistive element 18 and conductive regions 19 is fed by a pair of bias lines 19A.

As indicated in FIG. 1A, actuator section 11 has a thickness T while bending section 12 has a thickness t. (FIG. 1A is not drawn to scale.) For example, T could be in the range 7–20 μm and t could be in the range 1–5 μm. Because T is considerably larger than t, actuator section 11 is substantially stiffer than bending section 12. In particular, assuming a given force against tip 17, the deflection of cantilever 10 is the double integral of the bending moment divided by the moment of inertia and Young's modulus. The bending moment is a function of the force against tip 17, and Young's modulus is a characteristic of the material, both of which are fixed. The moment of inertia is a parameter defined by geometry and has the form:

$$\int\int y^2 \, dy \, dx$$

where x and y are the distances from the center of the structure in horizontal and vertical directions, respectively.

For the rectangular geometry of cantilever 10, the moment of inertia is proportional to the thickness cubed. Therefore, assuming a constant Young's modulus for the entire structure, a force applied against tip 17 produces little bending in actuator section 11 because actuator section 11 is stiffer than bending section 12 by a factor of $T^3/t^3$.

A voltage $V_{pe}$ is applied to the electrodes 15A and 15B of piezoelectric element 13. As is well-known, the zinc oxide intermediate layer expands and contracts as $V_{pe}$ is varied, causing actuator section 11 to bend. Since the base of cantilever is fixed, the bending of actuator section 11 causes the position of the tip 17 to change in a vertical direction.

With this configuration, the bending of actuator section 11 is effectively decoupled from the bending of section 12. That is, a perpendicular force against tip 17 will cause significant bending in section 12 but will have relatively little effect in actuator section 11. Conversely, the bending of actuator section 11 that is caused by the operation of piezoelectric element 13 is able to move or bend section 12 with little difficulty.

Figure 1B:
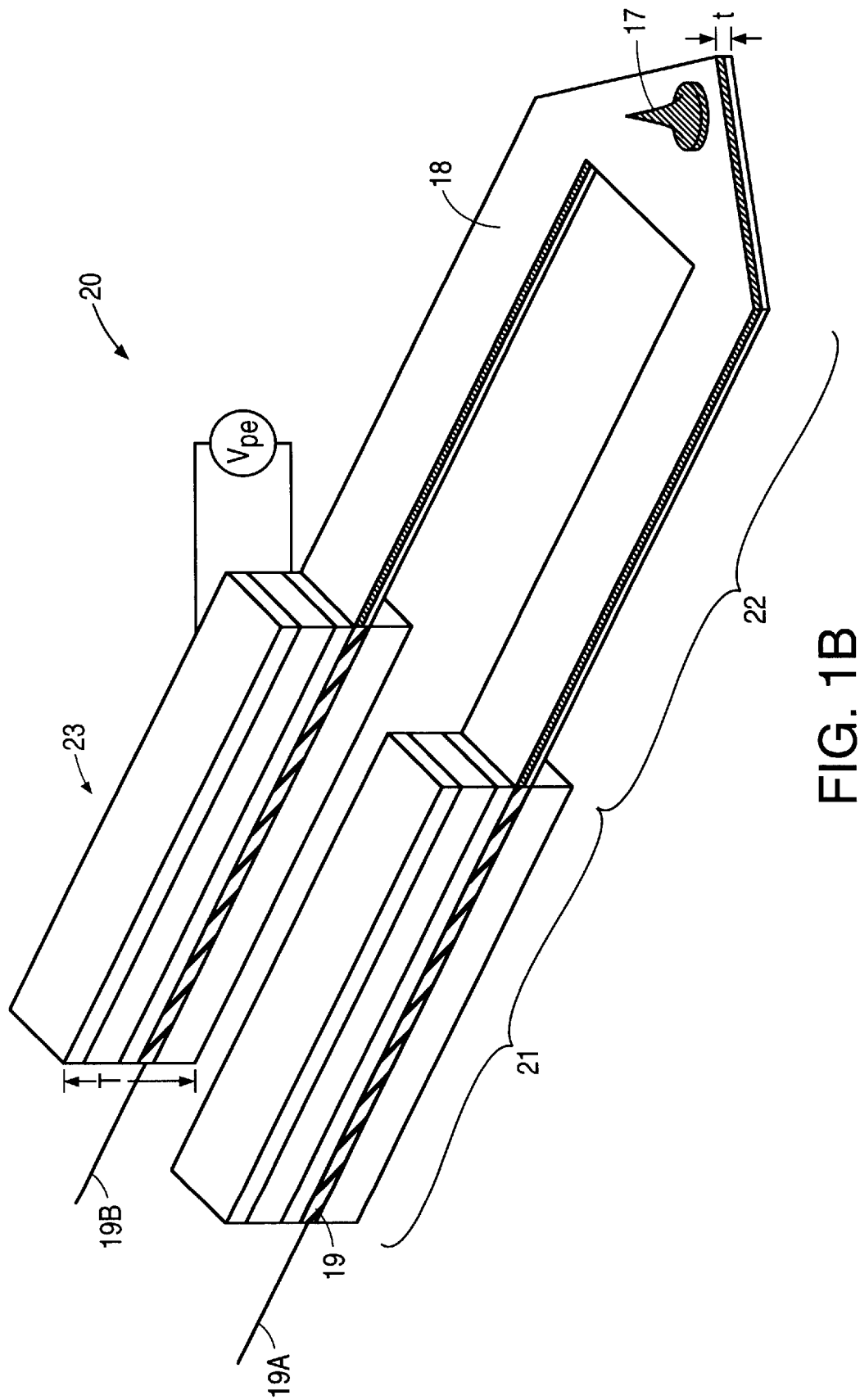
FIG. 1B illustrates a perspective view of a cantilever representative of a second embodiment in accordance with the invention.

FIG. 1B illustrates a modified cantilever 20 in which the thickness t of section 22 is reduced to further increase the decoupling between sections 21 and 22.

A method of fabricating a cantilever similar to cantilevers 10 and 20 is described in the parent application Ser. No. 08/296,340, now abandoned which is incorporated herein by reference in its entirely.

As is well-known, cantilever 10 is scanned over a sample surface as tip 17 detects the topological features of the surface. Typically, the tip of the cantilever faces downwards and the cantilever is thus inverted from the position shown in FIG. 1A.

Figure 2:
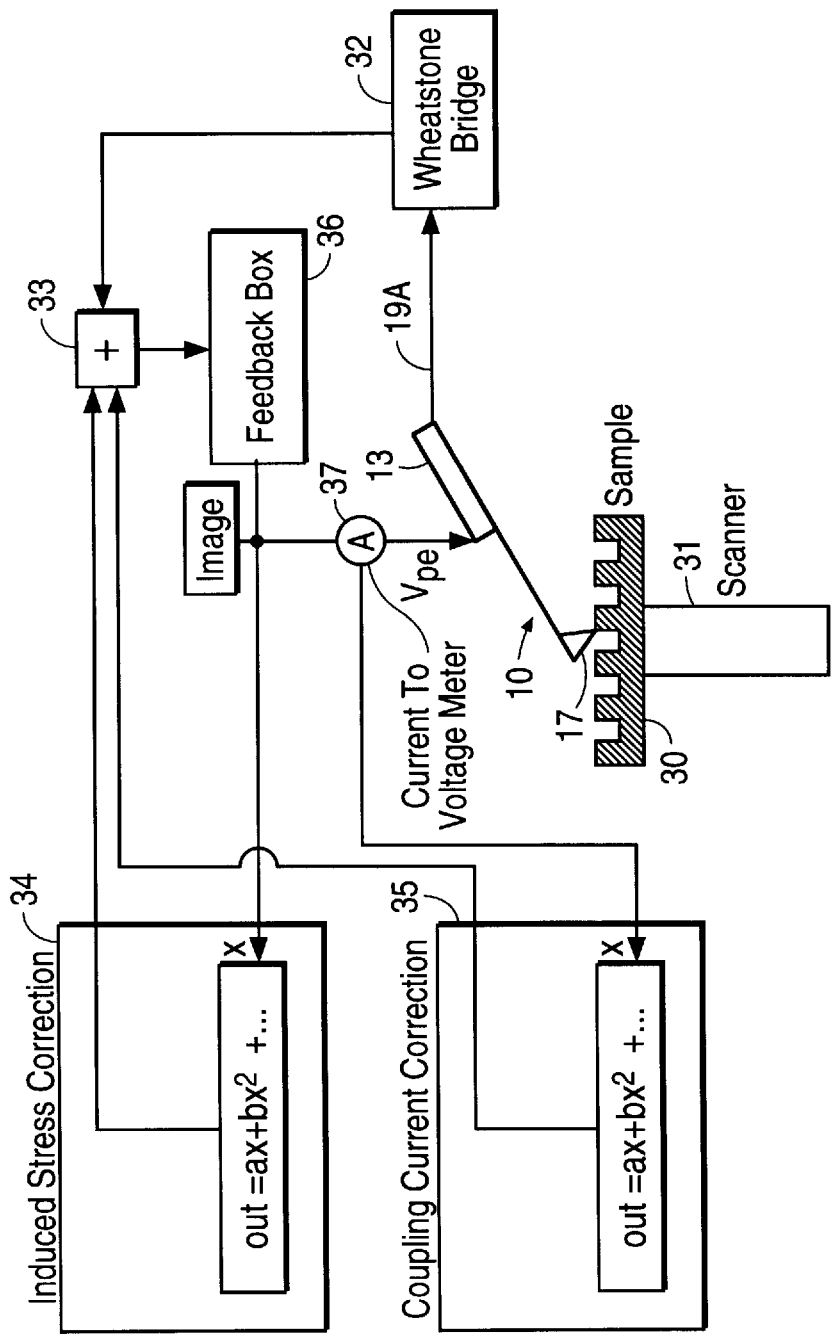
FIG. 2 illustrates a schematic block diagram of a cantilever and associated feedback system of an atomic force microscope designed to operate in the constant force mode.

FIG. 2 illustrates, in block form, the feedback system that is used to control cantilever 10 when it is operating in the constant force mode. A sample 30 is mounted in a normal fashion on a piezoelectric tube scanner 31. Tube scanner 31 moves sample 30 in a horizontal pattern, typically so as to cause tip 17 to trace a raster pattern on the surface of the sample. Piezoresistive element 18 is connected as part of a Wheatstone bridge 32 (see FIG. 3A). The output of Wheatstone bridge 32 is fed to a summing unit 33, where it is added to the respective outputs of an induced stress correction unit 34 and a coupling current correction unit 35, one embodiment of which is shown in FIG. 3E. The summed outputs are then delivered to a feedback box 36 (See FIG. 3B). The output of feedback box 36 is used to generate an image of sample 30 and is also sent as $V_{pe}$ to piezoelectric element 13. The output of feedback box 36 is also delivered to induced stress correction unit 34, and via a current-to-voltage meter 37 to coupling current correction unit 35.

Figure 3A:
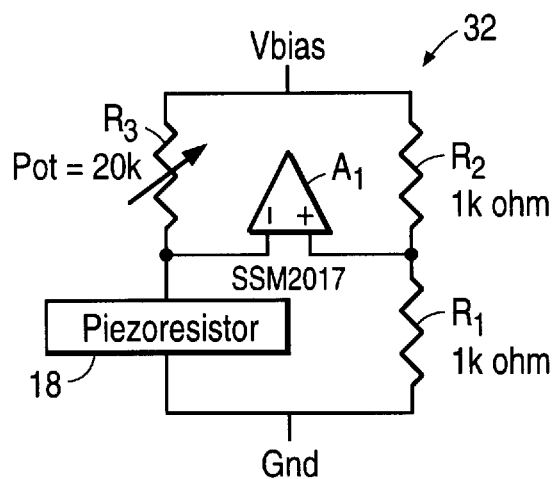
FIG. 3A illustrates a block diagram of the Wheatstone bridge in the feedback system of FIG. 2.

As shown in FIG. 3A, piezoresistive element 18 is connected in Wheatstone bridge 32 along with resistors $R_1$ and $R_2$ and a variable resistor $R_3$, which is used for adjustment purposes. Normally, the resistance of variable resistor $R_3$ is set to equal the resistance of piezoresistor 18 when the latter is in an unflexed condition. The resistors $R_1$–$R_3$ and piezoresistor 18 are connected in parallel conduction paths between a Vbias and ground. The common points between resistors $R_1$ and $R_2$ and between variable resistor $R_3$ and piezoresistive element 18 are delivered to the inputs of an amplifier $A_1$. As section 12 of cantilever 10 bends, the resistance of piezoresistive element 18 varies, and amplifier $A_1$ delivers an output which is representative of the bending of section 12.

Figure 3B:
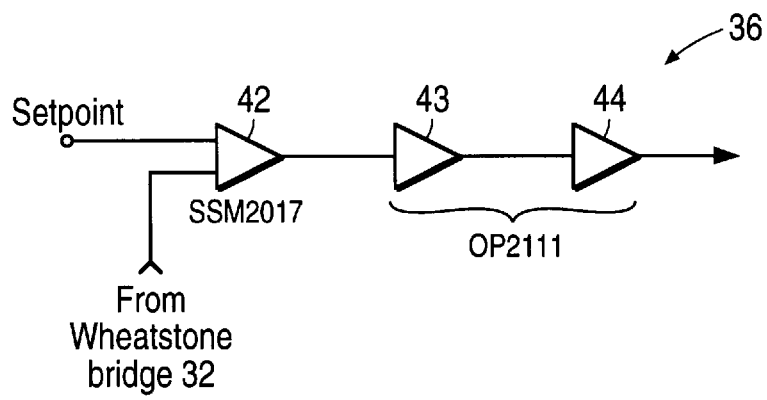
FIG. 3B illustrates a block diagram of the feedback box in the feedback system of FIG. 2.

Feedback box 36, which is illustrated in FIG. 3B, contains a summing unit 42, a gain unit 43 and an integrator 44. The inputs of summing unit 42 are the signal from Wheatstone bridge 32 and a setpoint which is used to set the desired force between the tip of the cantilever and the sample surface. In a conventional manner, the output of summing unit 42 is amplified in gain unit 43 and integrated in integrator 43.

In other embodiments of this invention, feedback box 36 could employ, instead of an integral feedback, proportional feedback or differential feedback, or a combination thereof.

Accordingly, when cantilever 10 is operating in the contact mode, the bending of section 12 is detected in Wheatstone bridge 32 and sent via feedback box 36 to piezoelectric element 13. Piezoelectric element 13 causes actuator section 11 to bend so as to restore the desired force between tip 17 and the surface of sample 30. As distinguished from many prior art systems, the output of feedback box 36 is not sent to piezoelectric tube scanner 31 to restore the desired force between tip 17 and sample 30.

Figure 3C:
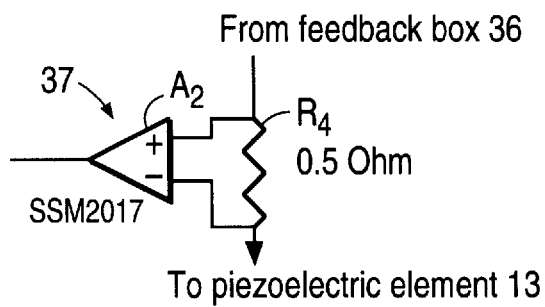
FIG. 3C illustrates a block diagram of the current-to-voltage meter in the feedback system of FIG. 2.
Figure 3D:
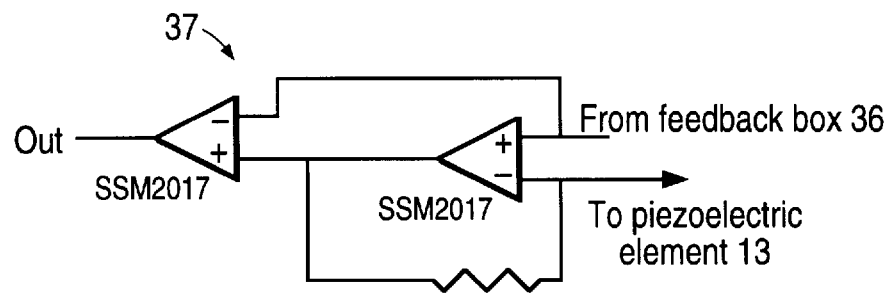
FIG. 3D illustrates a block diagram of an alternative current-to-voltage meter that can be used in the feedback system.
Figure 3E:
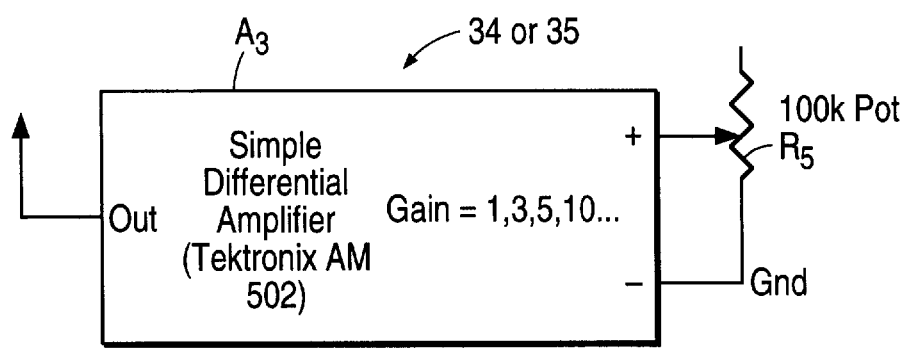
FIG. 3E illustrates a block diagram of the amplifier used to correct for induced piezoresistive stress and coupling current in the feedback system of FIG. 2.

As shown in FIG. 3C, current-to-voltage meter 37 includes an amplifier $A_2$ and a resistor $R_4$, the latter being connected in the series path between feedback box 36 and piezoelectric element 13 and across the input terminals of amplifier $A_2$. The output of amplifier $A_2$ is thus a voltage which represents the size of the current flowing into piezoelectric element 13.

Units 34 and 35 are used to adjust for errors which may occur in the system. Considering first induced stress correction unit 34, conductive region 19 (FIG. 1A) is heavily doped so as to be as conductive as possible, but in some circumstances it may retain some piezoresistive properties. In these cases, the bending of actuator section 11 by piezoelectric element 13 may create a piezoresistive effect which is read by Wheatstone bridge 32 as resulting from a bending in section 12. As shown in FIG. 3E, induced stress correction unit 34 contains an amplifier $A_3$ having a specified gain. In many instances the piezoresistive effect induced in region 19 is a linear function of $V_{pe}$. Amplifier $A_3$ is calibrated by varying $V_{pe}$ while the tip 17 is suspended in mid-air. When the change in resistance of region 19 as a function of $\Delta V_{pe}$ has been determined, amplifier $A_3$ is adjusted so as to compensate for this effect, i.e., the value of the parameter "a" in the transfer function out =ax is determined (see FIG. 2). This is accomplished by setting the gain of the amplifier itself as well as adjusting the resistance provided by potentiometer $R_5$. If the relationship between $\Delta V_{pe}$ and the voltage drop across bias lines 19A is nonlinear (e.g., out= $ax+bx^2$), a more complex amplifier may have to be used for unit 34.

Since piezoelectric element 13 acts as a capacitor, at higher frequencies a substantial current may flow through it, and this current may in turn induce a current in conductive region 19 which will produce a spurious output on bias lines 19A. This can occur either when cantilever 10 is used in the dynamic or intermittent contact mode, where $V_{pe}$ is an oscillating signal which causes the cantilever to vibrate at a frequency near resonance, or when cantilever 10 is used in the constant force mode, where high frequencies may be generated by feedback box 36.

As described above, the output signal from current-to-voltage meter 37 represents the current flowing into piezoelectric element 13. Coupling current correction unit 35 compensates for the effect of the current induced in conductive region 19 as a result of the current into piezoelectric element 13. Unit 35 is calibrated by applying a range of frequencies to piezoelectric element 13 and measuring the shifts in the output voltage on lines 19A as the frequency is varied. Typically, there is no effect until the frequency reaches a certain level, and after that point is reached the output voltage varies linearly with frequency. Again, a linear amplifier will often suffice, but a second or higher order amplifier may be required if the relationship between the frequency of $V_{pe}$ and the spurious output on lines 19A is not linear.

When the cantilever is operating, the respective outputs of units 34 and 35 are added to the output of Wheatstone bridge 32 so that the signal $V_{pe}$ delivered to piezoelectric element 13 has been adjusted to compensate for the induced stress and coupling current effects. If units 34 and 35 are omitted from the arrangement shown in FIG. 2, the output of Wheatstone bridge 32 is directed to the input of feedback box 36, and current-to-voltage meter 37 is omitted.

Figure 4:
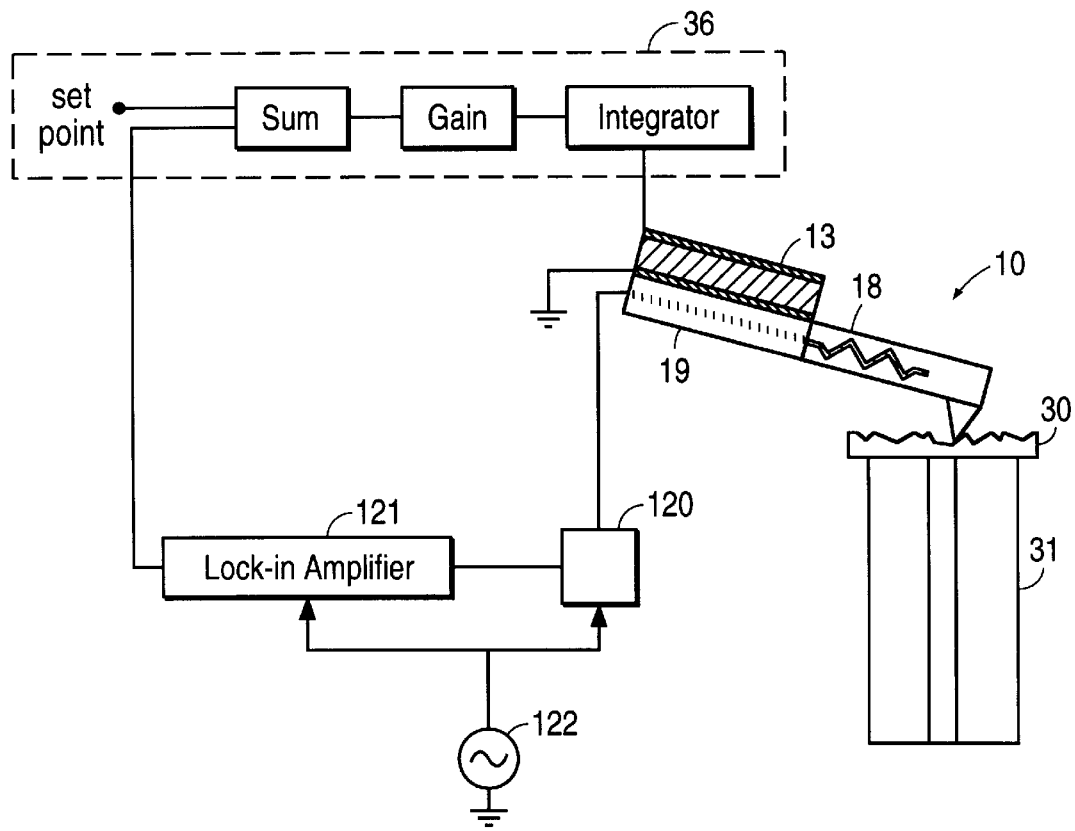
FIG. 4 illustrates an arrangement including a lock-in amplifier which can be used to correct for capacitive coupling between piezoelectric element and piezoresistor.
Figure 6:
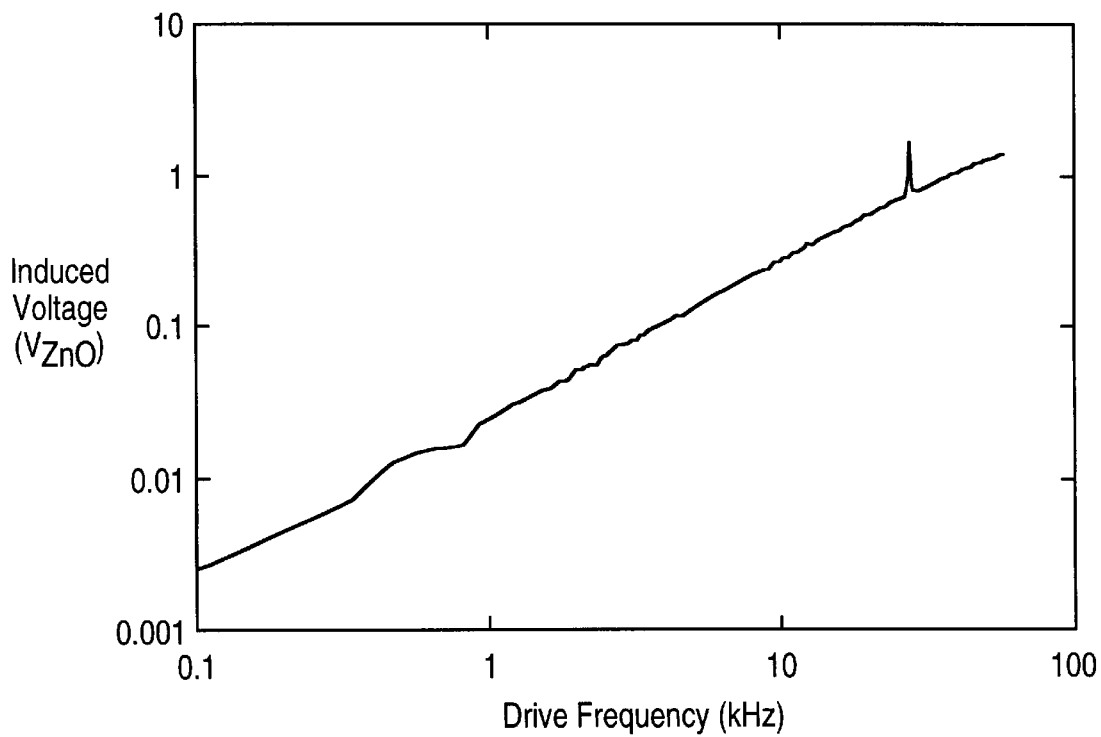
FIG. 6 illustrates a graph which shows the variation of the voltage across the piezoresistor as a function of the frequency of the signal used to drive piezoelectric element.
Figure 5:
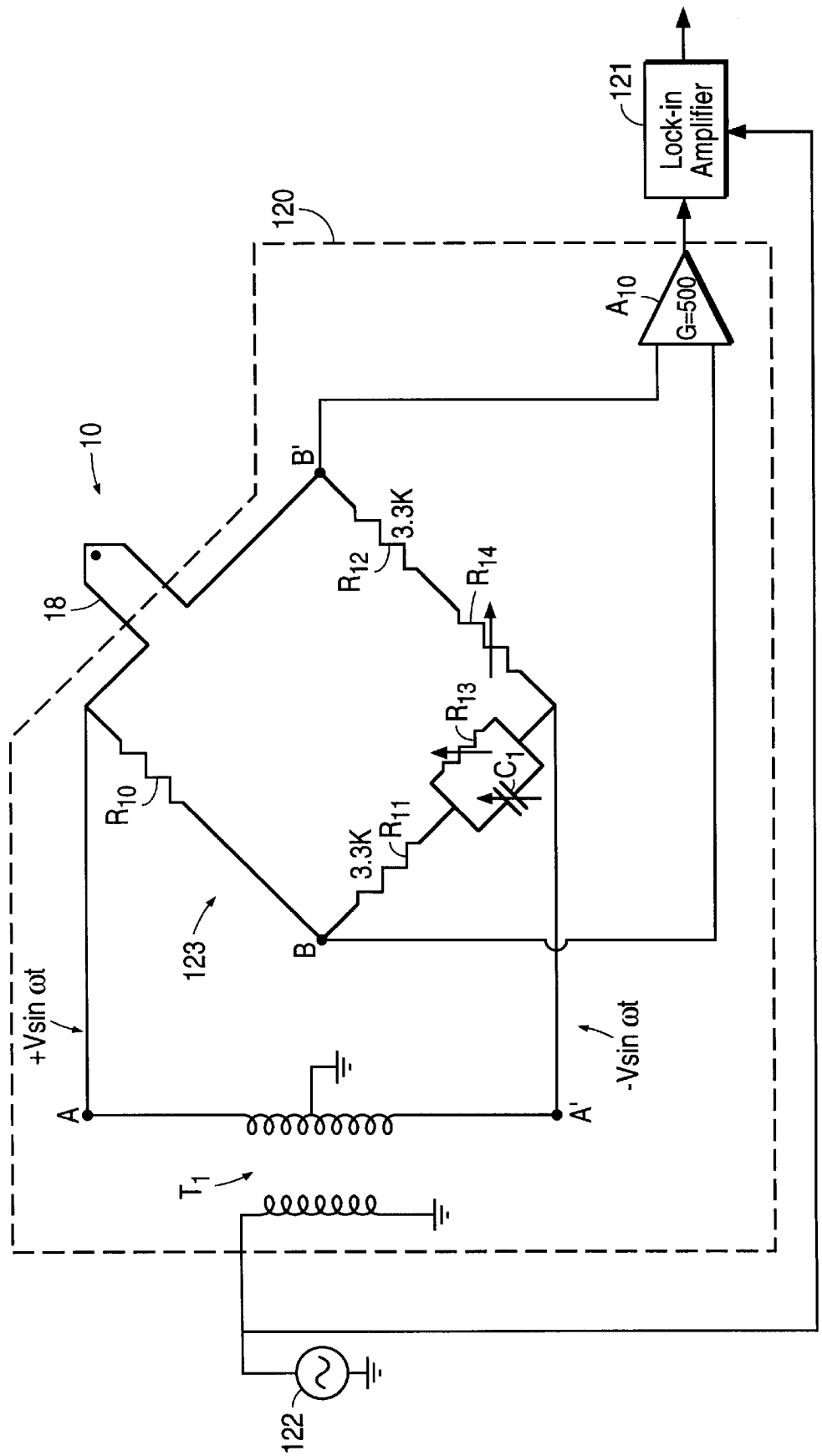
FIG. 5 illustrates a circuit diagram of the balance circuit in the arrangement shown in FIG. 4.

FIGS. 4 and 5 illustrate an alternative arrangement which can be used to correct for the capacitive coupling between piezoelectric element 13 and piezoresistor 18. FIG. 6 illustrates a graph which shows the variation of the voltage across piezoresistor 18 as a function of the frequency of the signal used to drive piezoelectric element 13. The data in FIG. 6 were derived experimentally by applying an AC drive signal to piezoelectric element 13 with the tip of the cantilever suspended in midair and measuring the voltage across piezoresistor 18. The vertical axis of FIG. 6 is in units of mV per $V_{ZnO}$, where $V_{ZnO}$ is the amplitude of the AC signal applied to piezoelectric element 13. Since the tip is not in contact with a surface, the piezoresistor is unstressed (except at the resonant frequency evidenced by the spike at about 28 kHz). If there were no capacitive coupling, the curve in FIG. 6 would be a horizontal line at 0 mV/$V_{ZnO}$.

In the arrangement shown in FIG. 4, the elements which are the same as those shown in FIG. 2 are designated by similar numbers. In place of Wheatstone bridge 32, however, a balancing circuit 120 is connected to piezoresistor 18, and an output of balancing circuit 120 is delivered to a lock-in amplifier 121. Balancing circuit 120 and lock-in amplifier 121 are driven by an oscillator 122, which in this embodiment operates at 130 kHz.

FIG. 5 illustrates a circuit diagram of balance circuit 120. An output of oscillator 122 is directed to a transformer $T_1$ which has a grounded center-tapped secondary coil and produces equal and opposite sinusoidal signals at nodes A and A' (shown as V sin ωt and −V sin ωt). Piezoresistor 18 is connected into a bridge 123, which includes a resistor $R_{10}$ having a resistance equal to piezoresistor 18. Resistors $R_{11}$ and $R_{12}$ are also balanced (in this embodiment at 3.3K). Resistor $R_{11}$ is in series with the parallel combination of a variable resistor $R_{13}$ and a variable capacitor $C_1$. Resistor $R_{12}$ is in series with a variable resistor $R_{14}$. Bridge 123 is balanced such that the voltages at nodes B and B' are both equal to zero when the cantilever is undeflected by adjusting resistors $R_{13}$ and $R_{14}$ and by adjusting capacitor $C_1$ to match the parasitic capacitance in the circuit. Nodes B and B' are connected to the inputs of a differential amplifier $A_{10}$, which in this embodiment has a gain of 500. The output of differential amplifier $A_{10}$, whose amplitude represents the deflection of cantilever 10, feeds an input of lock-in amplifier 121. Lock-in amplifier 121 demodulates the output of balance circuit 120 and delivers the demodulated signal to feedback unit 36. As shown in FIG. 4, the output of feedback unit 36 flows to the upper electrode of piezoelectric element 13.

Using the arrangement shown in FIGS. 4 and 5, any spurious signals in piezoresistor 18 which are created by capacitive coupling between piezoelectric element 13 and piezoresistor 18 will be at frequencies which are well below 130 kHz and will therefore be ignored by lock-in amplifier 121.

Figure 7A:
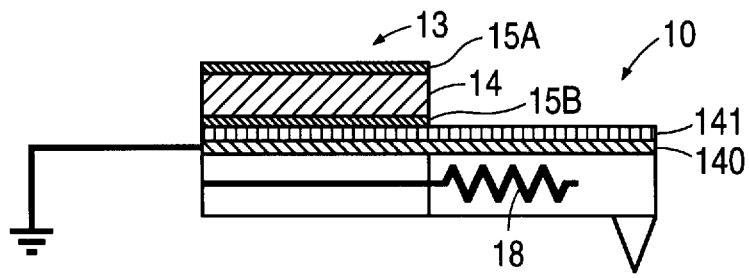
FIGS. 7A and 7B illustrate embodiments of a cantilever in which a shield layer is used to prevent electrical coupling between the piezoelectric element and the piezoresistor.
Figure 7B:
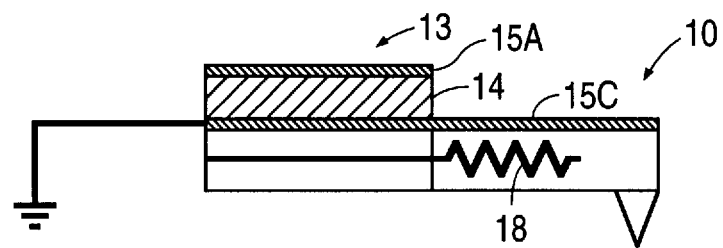

FIGS. 7A and 7B illustrate other arrangements that can be used to minimize any capacitive coupling between piezoelectric element 13 and piezoresistor 18. In FIG. 7A, a conductive shield layer 140, preferably of metal, has been interposed between piezoelectric element 13 and piezoresistor 18. Shield layer 140 covers the top surface of cantilever 10 and is separated from piezoelectric element 13 by an insulating layer 141, which could be formed of an oxide or nitride. Shield layer 140 is grounded. FIG. 7B illustrates a modified version in which a bottom electrode 15C of piezoelectric element 13 extends over the top surface of cantilever 10. Since electrode 15C is grounded, it acts as a shield to prevent the input signal to piezoelectric element 13 from being electrically coupled to piezoresistor 18.

Figure 8A:
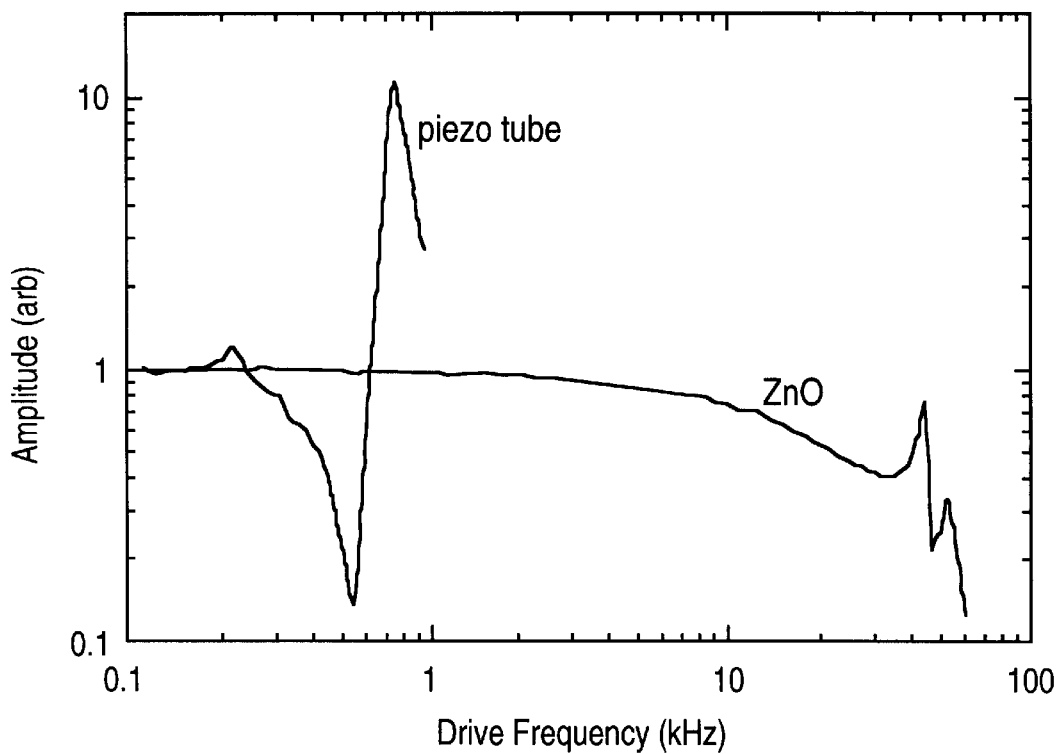
FIGS. 8A and 8B illustrate the amplitude and phase response, respectively, of a cantilever having an integral piezoelectric element and piezoresistor.
Figure 8B:
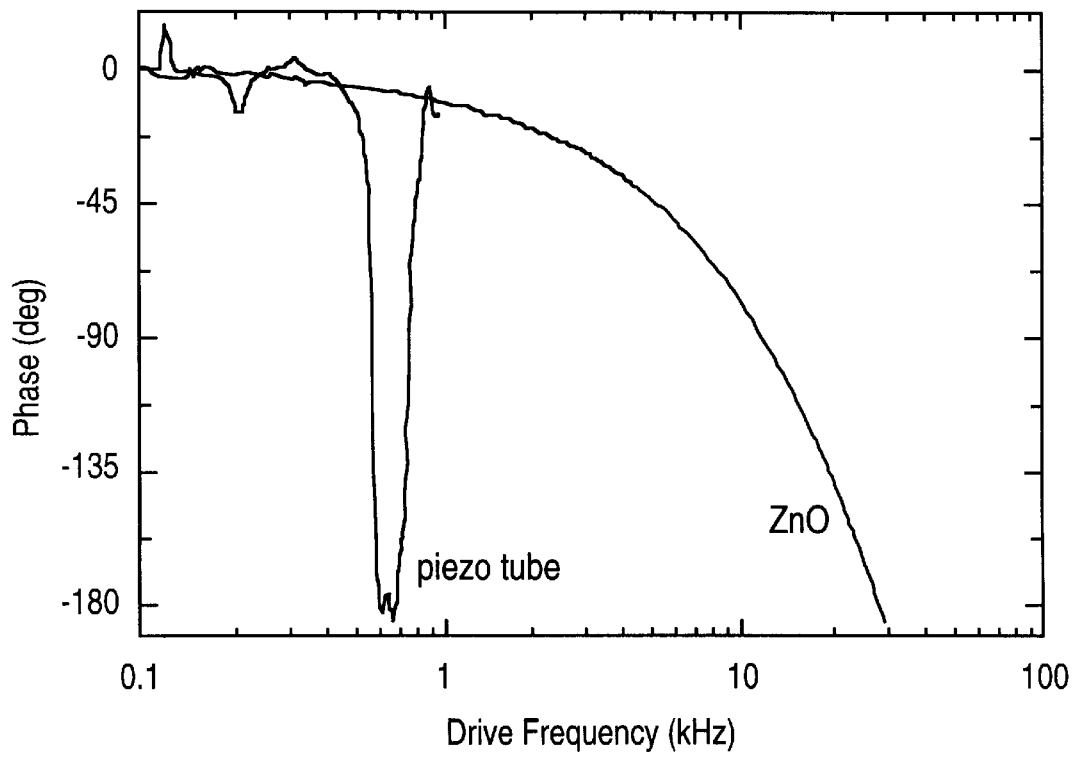

FIGS. 8A and 8B illustrate the amplitude and phase response of a cantilever having an integral piezoelectric element and piezoresistor. The cantilever had a length of 620 μm and a ZnO piezoelectric element at its base which accounted for 265 μm of the total length. The piezoelectric element had a thickness equal to that of the cantilever beam (3.5 μm) and was able to deflect the cantilever up to 4 μm. The cantilever was placed with its tip in contact with a fixed surface, and the piezoelectric element was driven at various sinusoidal frequencies. The amplitude and phase shift of the cantilever were recorded with an additional lock-in amplifier, which in this test was used in conjunction with a voltage divider arrangement rather than the preferred bridge circuit shown in FIG. 5.

Assuming an allowable phase margin of 45°, FIGS. 8A and 8B indicate that the cantilever had a maximum imaging frequency (bandwidth) of about 6.4 kHz. The resonance of the cantilever with its tip in contact with the sample surface was near 44 kHz. The gradual roll-off of the phase below the resonance frequency of the cantilever indicates that the imaging bandwidth was limited by the detection electronics rather the mechanical response of the cantilever. An imaging bandwidth equal to the resonant frequency should be attainable if the piezoresistor and lock-in amplifier are driven at a frequency much higher than resonance.

Also shown in FIGS. 8A and 8B are the amplitude and phase characteristics of a piezoelectric tube actuator having a length of 2 inches (a commonly used size for scans of up to 100 μm). The sharp phase shift near 550 Hz is associated with the significantly lower resonance of the piezoelectric tube.

Using an arrangement similar to that shown in FIGS. 4 and 5, an image of an integrated circuit was taken with a tip velocity of 1.6 mm/sec. The sample, which contained vertical steps 1.5 μm in height, was raster scanned over a 15

μm×15 μm area using a one-inch long piezoelectric tube with a fast scan rate of 50 Hz. A high resolution image of 512×512 pixels was obtained in about 15 seconds. By adding an interlace to the slow scan (which was ramped with a triangular wave) and changing the pixel array to 128×128, it was possible to obtain images at a rate of several frames per second.

Figure 9A:
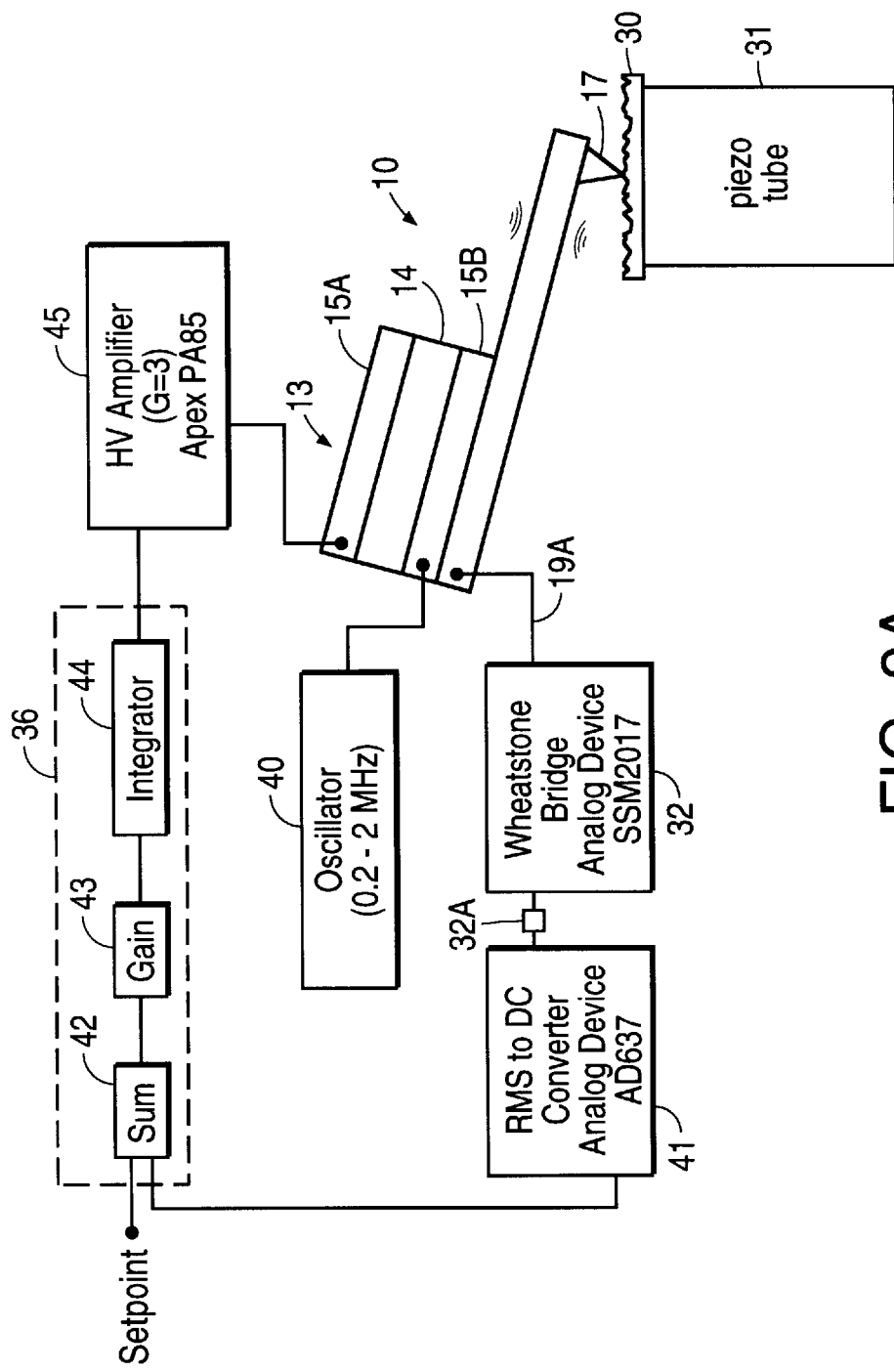
FIG. 9A illustrates a schematic block diagram of a cantilever and associated feedback system of an atomic force microscope designed to operate in the dynamic or intermittent contact modes.

A feedback system which is particularly suitable when cantilever 10 is operating in the dynamic or intermittent contact modes is illustrated in FIG. 9A. Electrode 15B of piezoelectric element 13 is connected to the output of an oscillator 40, which in this example supplies a voltage signal with a frequency in the range of 200 KHz to 2 MHz and an amplitude ranging from 10 mV to 20 V. With cantilever 10 vibrating, the output of Wheatstone bridge 32 is an oscillating signal which is passed to an RMS-to-DC converter 41. To reduce mechanical coupling from the induced zinc oxide actuation, the output of Wheatstone bridge 32 is first passed through a high-pass filter 32A. This added filter attenuates frequencies in the imaging bandwidth while passing frequencies near the cantilever driving frequency. RMS-to-DC converter 41 acts as an amplitude detector which delivers a DC output which is representative of the root mean square of the amplitude of the signal delivered by Wheatstone bridge 32. Other devices, such as homodyne detectors, synchronous demodulators and lock-in amplifiers, could be used in place of RMS-to-DC converter 41 as an amplifier detector.

The output of RMS-to-DC converter 41 is summed with the setpoint voltage in summing unit 42 and is passed through gain unit 43 and integrator 44 to a high voltage amplifier 45. The output of amplifier 45 is delivered to electrode 15A of piezoelectric element 13. As tip 17 encounters features of sample 30, the force gradient between the tip and sample varies, causing the vibrational amplitude of cantilever 10 to change. This change is reflected in the output of Wheatstone bridge 32 and consequently in the DC voltage delivered by RMS-to-DC converter 41. After being summed and amplified, this altered DC signal is delivered to electrode 15A of piezoelectric element 13, causing the cantilever to bend by an amount necessary to restore the required separation between tip 17 and sample 30.

An important feature of this arrangement is that piezoelectric element 13 is used to cause cantilever 10 to vibrate and at the same time to control the tip-sample separation. This is accomplished by superimposing or summing the respective outputs of amplifier 45 and oscillator 40. (While piezoelectric element actually sees the difference between these signals, the effect is the same as summing because the output of oscillator 40 is typically a sinusoidal signal. Subtracting a sinusoidal signal from a DC signal is equivalent to adding the DC to the sinusoidal signal phase-shifted by 180 degrees.)

Alternatively, one of the electrodes of piezoelectric element 13 could be grounded and the outputs of oscillator 40 and amplifier 45 could be delivered to an external summing amplifier, with the output of summing amplifier being passed to the other electrode of the piezoelectric element. The arrangement shown in FIG. 9A, however, avoids the need for the external summing amplifier.

Figure 9B:
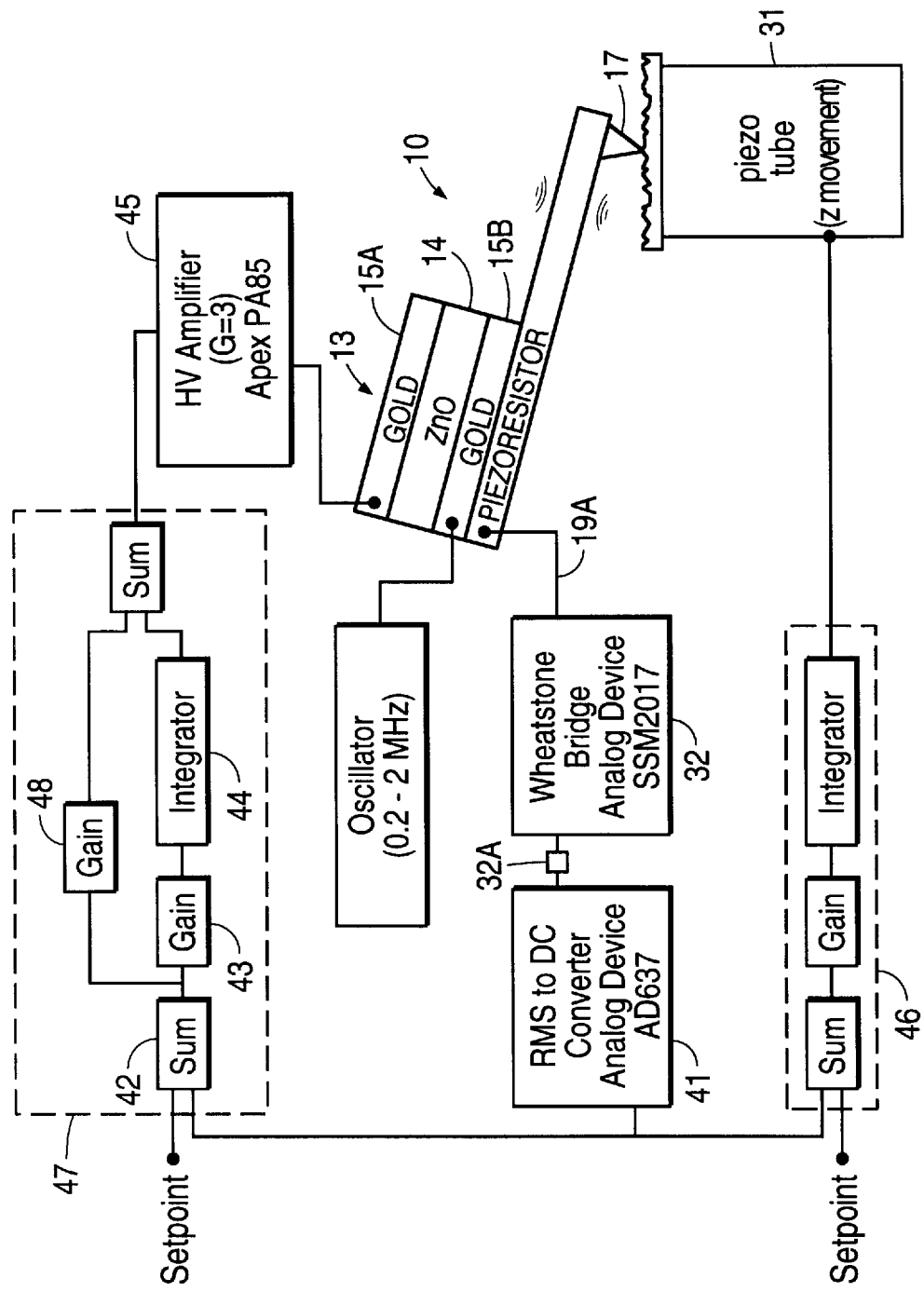
FIG. 9B illustrates a schematic block diagram of a dual feedback system that could be used in place of the feedback system shown in FIG. 9A.

In other embodiments, piezoelectric tube 31 is used in combination with piezoelectric element 13 to control the tip-sample separation of cantilever 10. The dual feedback system for such an embodiment is shown in FIG. 9B. The output of RMS-to-DC converter 41 is also connected to an integral feedback box 46 which is similar to feedback box 36, and the output of feedback box 46 is connected to the z-movement input of piezoelectric tube 31. A feedback box 47, which uses a combination of integral and proportional feedback, is substituted for feedback box 36. Feedback box 47 includes an additional gain unit 48 connected in parallel with gain unit 43 and integrator 44.

In the embodiment of FIG. 9B, the z-movement of piezoelectric tube 31 (which also controls the x,y movement of the sample) is used in combination which z-movement of piezoelectric element 13 to provide a constant tip-sample separation. In the preferred embodiment, piezoelectric tube 31 handles the low-frequency feedback, arising for example from the tilt of the sample and large topographical features in the sample, and piezoelectric element 13 handles the high frequency feedback which is necessary to increase the overall bandwidth of the system. The advantage of having piezoelectric tube 31 and piezoelectric element 13 share the control of the tip-sample separation is that the system is more tolerant of sample height changes (whether from sample tilt or other factors) that fall outside the range of the piezoelectric element 13. The overall quality of the feedback may also be improved.

Figure 10:
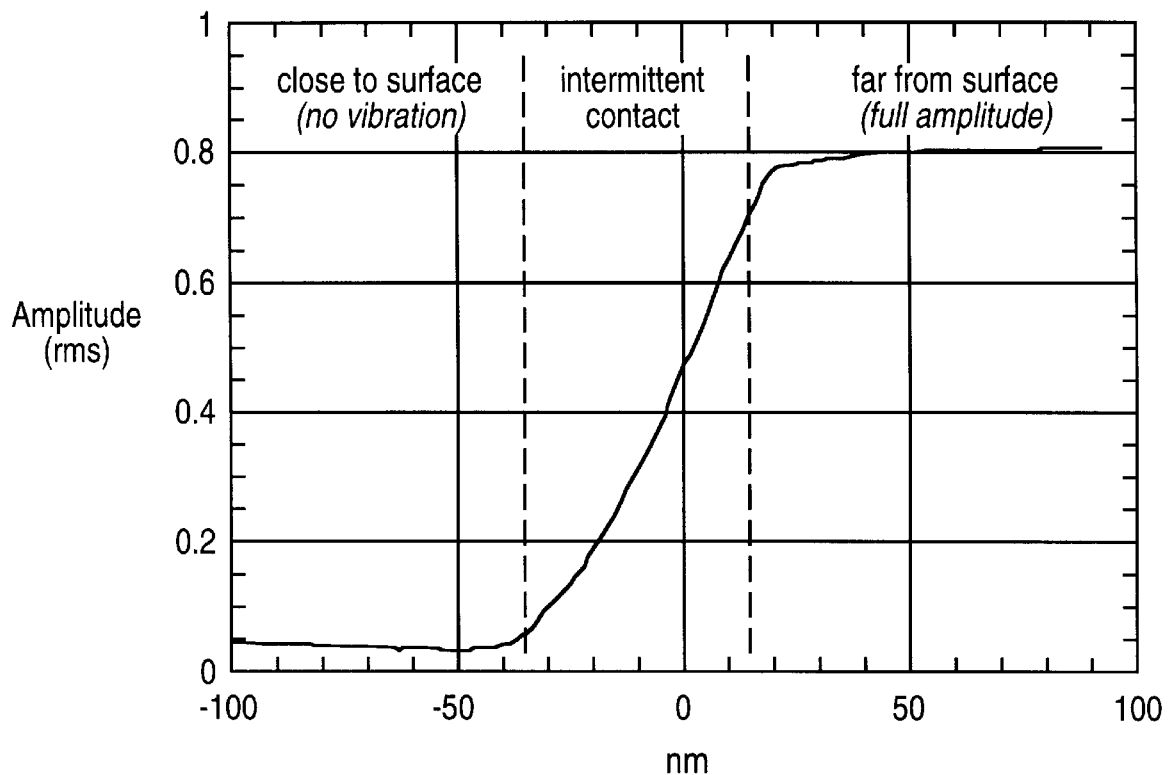
FIG. 10 illustrates a graph showing the vibrational amplitude of the cantilever as a function of tip-sample distance when the cantilever is operating in the intermittent contact mode.
Figure 11:
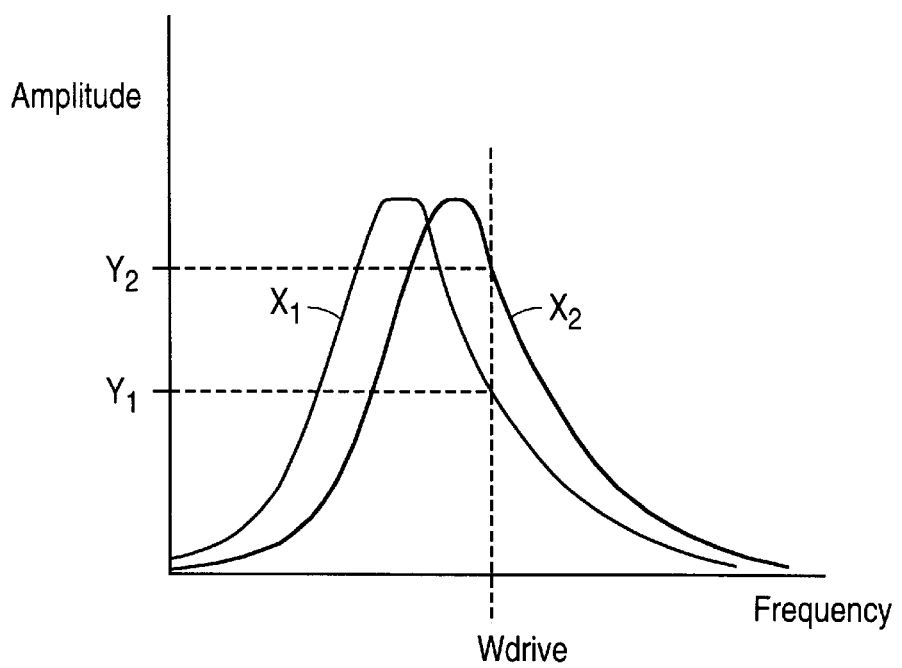
FIG. 11 illustrates a graph showing the shifting of the resonant frequency of the cantilever as the tip-sample distance varies.

FIGS. 10 and 11 illustrate changes in the behavior of cantilever 10 when it is operating in the dynamic or intermittent contact modes. In FIG. 10, the horizontal axis is the separation between the base of the cantilever and the sample in nanometers, with zero representing the separation that exists when the tip 17 and sample are in contact and tip 17 is not vibrating (negative separations thus represent conditions in which the cantilever is flexed). The vertical axis is the amplitude of vibration of cantilever 10 expressed in a normalized scale from 0 to 1. When the separation is less than about −40 nm, there is essentially no vibration. In the "intermittent contact" region, the vibrational amplitude increases quite linearly with increasing separation. Beyond the "intermittent contact" region, the sample does not interfere with the vibration of the cantilever, and the amplitude reaches a plateau.

FIG. 11 illustrates the vibrational amplitude of cantilever 10 at two tip-sample separations as the frequency of the output of oscillator 40 (FIG. 9A) is varied. Curve $X_1$ shows the amplitude when the tip is relatively close to the surface, and curve $X_2$ shows the amplitude when the tip is relatively far from the surface. Assuming an output of oscillator 40 at a frequency $W_{drive}$, it is seen that the amplitude increases from $Y_1$ to $Y_2$ as the tip is moved away from the surface of the sample. Referring to FIG. 9A, the difference between amplitude $Y_1$ and amplitude $Y_2$ is reflected in the output of Wheatstone bridge 32 and consequently the DC output of RMS-to-DC converter 41.

Figure 12A:
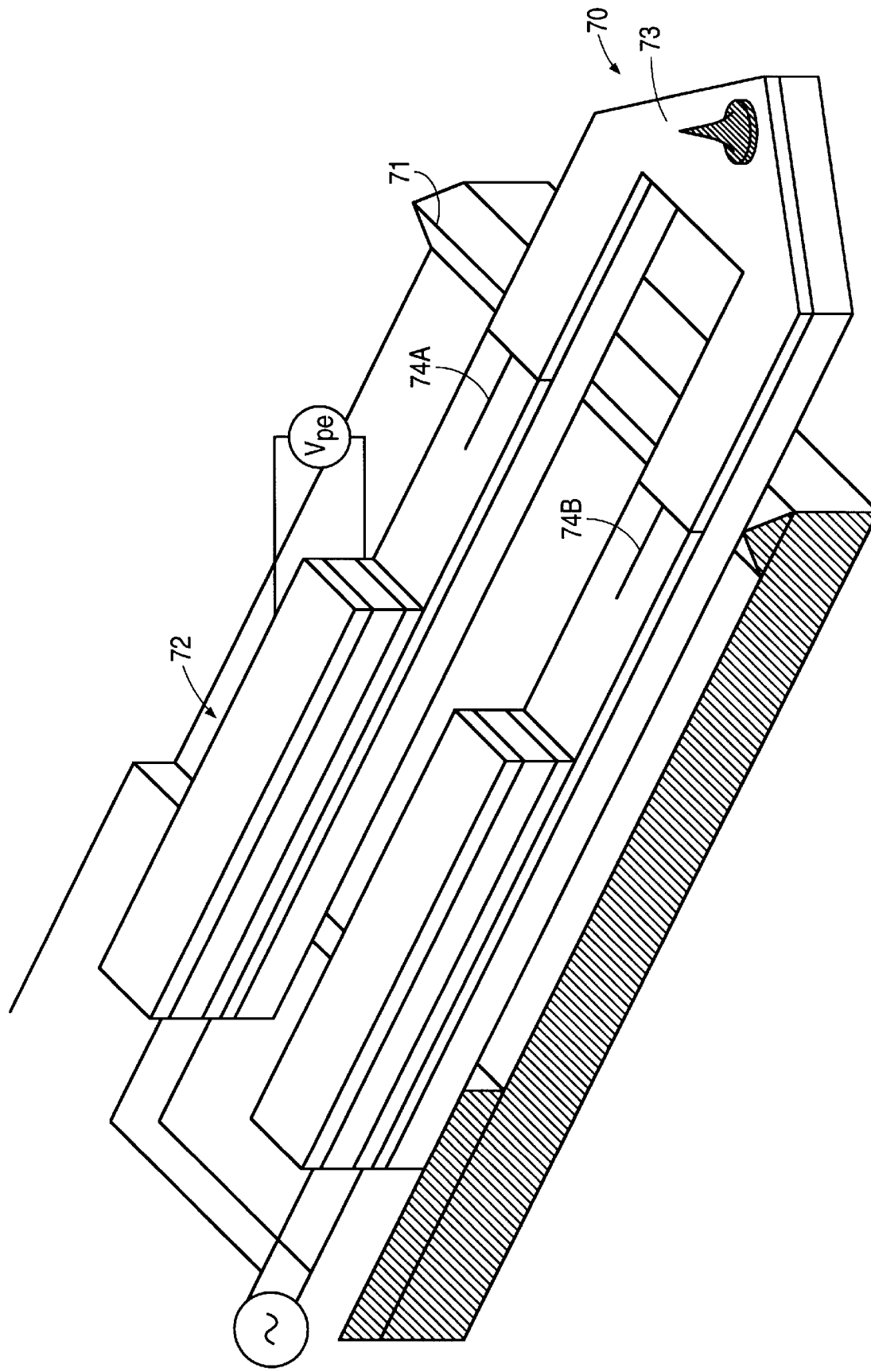
FIG. 12A illustrates an embodiment of a cantilever including a piezoelectric element to be used at non-fundamental vibrational frequencies.
Figure 13A:
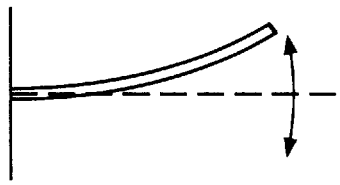
FIGS. 13A and 13B illustrate the fundamental and third resonant modes, respectively, of a vibrating cantilever.
Figure 13B:
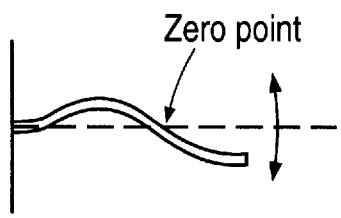

Correction units similar to induced stress correction unit 34 and coupling current correction unit 35 may also be used when the cantilever is operating in a dynamic or intermittent contact mode. FIG. 12A, however, illustrates an embodiment which may avoid the need for such corrections. It has been disclosed that cantilevers have several resonant modes of oscillation (see Luginbuhl et al., "Piezoelectric Cantilever Beams Actuated by PCT Sole-Jel Thin Film", Transducers '95 Eurosensors IX, pages 413–416). FIGS. 13A and 13B illustrate the fundamental and third resonant modes, respectively, in both of which the free end of the cantilever experiences a maximum amplitude of vibration. (The same is true in other higher order resonant modes in which the free end of the cantilever vibrates.) From FIG. 13B, it is apparent that there is a zero point approximately one-third of the distance from the tip of the cantilever.

In the embodiment of FIG. 12A, a cantilever 70 is supported by a knife edge 71 at the location of this zero point. Cantilever 70 is vibrated by a piezoelectric element 72, which is similar to piezoelectric element 13 shown in FIG. 1A. A piezoresistor 73 is formed in cantilever 70 in a manner similar to that used in forming piezoresistor 18 in cantilever 10 (FIG. 1A). Bias lines 74A and 74B connect to piezoresistor 73. Because there is no conductive region (similar to conductive region 19 shown in FIG. 1A) adjacent the piezoelectric element 72 the induced stress and current coupling problems discussed above are not incurred. In some embodiments a single piezoelectric element may be used to vibrate a group of cantilevers.

Figure 12B:
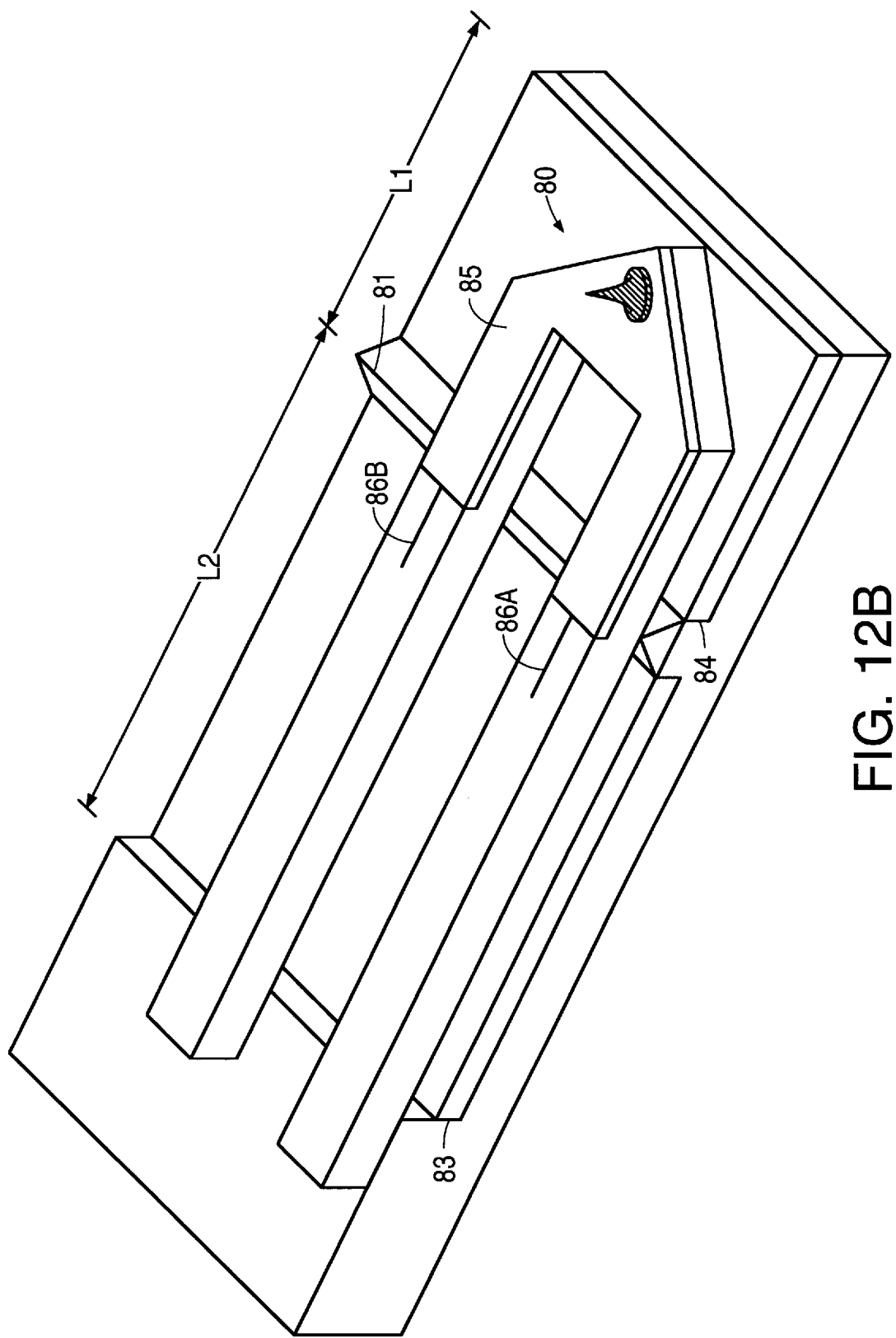
FIGS. 12B and 12C illustrate perspective and cross-sectional views, respectively, of a cantilever including a capacitive actuator to be used at non-fundamental vibrational frequencies.
Figure 12C:
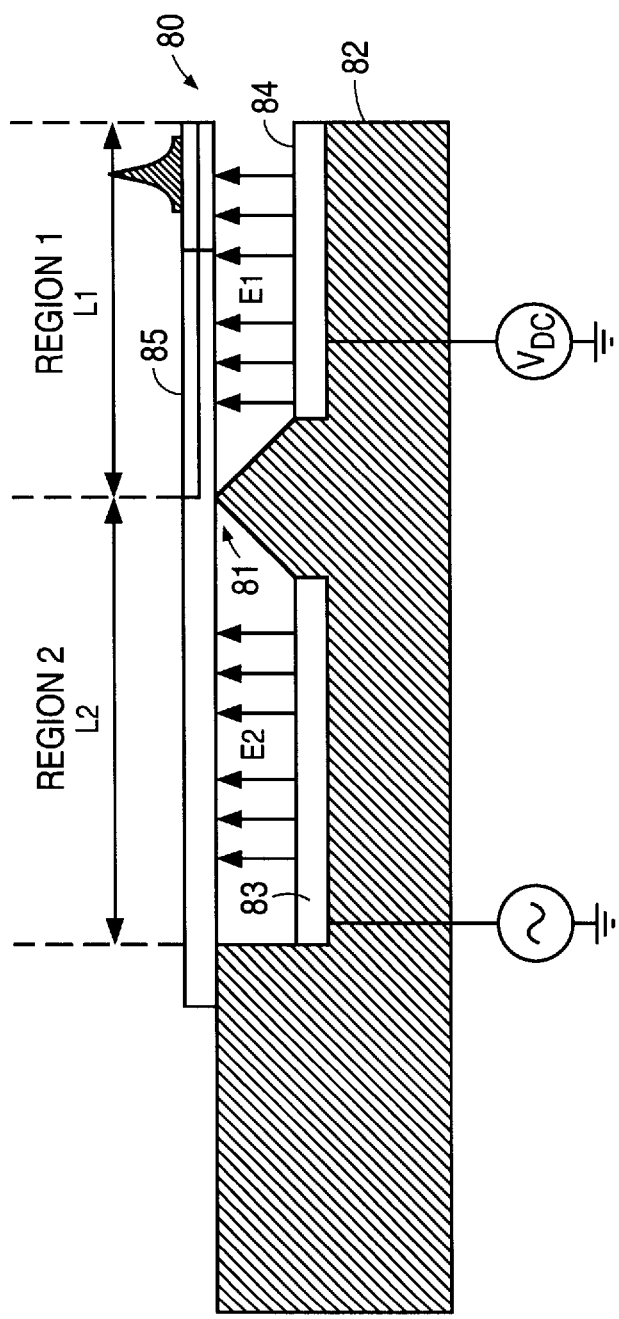

FIGS. 12B and 12C show perspective and cross-sectional views, respectively, of an embodiment which uses a capacitive or electrostatic actuator to control the cantilever. Cantilever 80 is supported by a knife edge 81. Knife edge 81 is positioned a distance L1 from the free end of the cantilever and a distance L2 from the base of the cantilever. A platform 82 beneath the cantilever extends from the base to the free end of the cantilever and beyond. Two conductive regions 83 and 84 are formed under the knife edge on opposite sides of the knife edge 81. If the platform 82 is formed of silicon, for example, conductive regions 83 and 84 may be heavily-doped implantations.

A piezoresistor 85 is formed in cantilever 80 in the region between the knife edge 81 and the tip of the cantilever. Piezoresistor 85 is supplied with a current through bias lines 86A and 86B, and conductive regions 83 and 84 are connected to voltage sources through lines that are not shown in FIGS. 12B and 12C.

An electric field E1 applied to conductive region 84 will pull the tip of the cantilever downward, and an electric field E2 applied to conductive region 83 will pull the tip of the cantilever upward. Thus, with this embodiment two independent mechanisms of control for cantilever 80 are provided. For example, as shown in FIG. 12C, an alternating signal could be applied to conductive region 83 at a frequency which corresponds to the second resonant mode of cantilever 80, with knife edge 81 being located at the zero point (see FIG. 13B). Simultaneously, a DC signal could be applied to conductive region 84 in order to control the sample-tip separation. In such an arrangement, piezoresistor 85 would detect the bending of cantilever in Region 1 and would be connected through a Wheatstone bridge to a feedback system which would provide a control signal for conductive region 84.

In another embodiment, an alternating signal could be applied to conductive region 84 and a DC signal could be applied to conductive region 83, or the cantilever could be operated in the contact mode with DC signals applied to conductive regions 83 and 84. Other variations will be apparent to those skilled in the art.

The speed at which images can be generated has been a limitation of scanning probe microscopy. For cantilevers operating in the contact mode, this is attributable primarily to the need to keep the frequency of the signal generated by the cantilever below the resonant frequency of the cantilever and the piezoelectric element that is used to control the tip-sample separation. The resonant frequency of a conventional piezoelectric tube is in the range of from 2 to 10 kHz. For a cantilever operating in the contact mode, a bandwidth in the range of 1 kHz generally permits a scanning frequency of 2 to 20 Hz, depending on the size of the scan. The typical scan rate is in the range 10 to 100 $\mu$m/sec.

A piezoelectric element such as element 13 shown in FIG. 1A has a significantly higher resonant frequency than that of a typical piezoelectric tube scanner. Piezoelectric tubes can have resonances down to 500 Hz depending on the size of the tube and the mass of the sample mounted on the tube, whereas a cantilever can have fundamental resonant frequencies as high as 1 MHz. This allows scan rates on the order of 1 mm/second, which is two orders of magnitude higher than the prior art norm. Operating in the intermittent contact mode, and vibrating the cantilever in a higher resonant mode at a frequency of 250 kHz, scan rates of more than 2 mm/second have been achieved. For scan sizes of a few microns, this allows the screen to be updated at a rate of more than once each second, and gives an atomic force microscope a "feel" similar to that of a scanning electron microscope. Since the tip only lightly taps the sample surface, it is not believed that tip wear will be a problem. Using the principles of this invention, high speed imaging can be used to map large areas of topography (up to 100×100 $\mu$m$^2$) while, if necessary, lower scanning speeds can be used where high resolution is necessary.

Using a cantilever with an integral actuator may also significantly reduce the time required to bring the tip of the cantilever safely to a position on or near the sample surface at the commencement of the analysis. This engage process entails lowering the cantilever towards the surface with a stepper motor until the cantilever sensor (piezoresistor, optical, etc.) receives information that the tip is near the surface and then signals the motor to stop or change speeds. The cantilever sensor may also signal a piezoelectric tube (on which the sample or cantilever is mounted) to quickly retract, thereby creating a short, controlled distance between the tip and the sample.

Because the response time of a typical piezoelectric tube is quite low, the approach must be made very slowly to insure that the tip is not damaged in a collision with the sample surface. Using an integral actuator to control the separation between the tip and the sample would reduce the response time from approximately 1 ms to 1 $\mu$s. This allows the stepper motor to lower the tip to the surface at a much more rapid rate, thereby significantly reducing the approach time. At present, the approach times for commercial scanning probe microscopes are on the order of a minute; using an integral actuator can reduce this time to less than a second.

While the preferred embodiment includes a piezoelectric element as the actuator and a piezoresistor as the deflection detector, other embodiments contain alternative devices for the actuator and deflection detector. Several of these alternative embodiments are described below.

A capacitive plate of the kind described in parent application Ser. No. 08/296,340 can be used in place of the piezoelectric element as the actuator. FIG. 14 illustrates a capacitive plate 90 which is formed adjacent a cantilever 91. Capacitive plate 90 is formed in the actuator section 11 and terminates before the beginning of the bending section 12. An electric signal is applied between capacitive plate 90 and cantilever 91 to cause the actuator section 12 to bend or vibrate in the manner described above.

FIGS. 15A, 15B and 15C illustrate several alternative deflection detectors which can be used in embodiments of the invention. FIG. 15A shows an optical detector in which a laser beam 100 is reflected off the back of cantilever 101. As cantilever 101 deflects, the reflected laser beam strikes a position sensitive photodetector 102 at different locations, allowing the deflection of cantilever 100 to be measured. The displacement of beam 100 at photodetector 102 is equal to the deflection of the cantilever 101 multiplied by the ratio between the distance of the detector from the cantilever and the length of the cantilever. A piezoelectric element 103 is shown in actuator section 11. The optical detection method is described in G. Meyer et al., Appl.Phys.Lett. 53, 1045 (1988), which is incorporated herein by reference in its entirety.

FIG. 15B shows an interferometric detector 104 which includes an optical fiber. An optical cavity is formed between the end of the fiber and the back of cantilever 101. The interference between light reflected off the back of the cantilever and light reflected at the end of the fiber is used to measure the position of the cantilever. The interferometric detection method is described in R. Erlandsson et al., J.Vac.Sci.Technol., A 6, 266 (1988), which is incorporated herein by reference in its entirety.

FIG. 15C shows a deflection detector in which a capacitive plate 105 is placed parallel to the cantilever. A voltage is impressed between the cantilever and the capacitive plate, and variations in the capacitance are measured as the cantilever deflects. The capacitive detection method is described in T. Göddenhenrich et al., J.Vac.Sci.Technol., A 8, 383 (1990). A process of fabricating a capacitive plate adjacent to a cantilever is described in J. Brugger et al., MME '92, Third European Workshop on Micromachining, Micromechanics and Microsystems. Each of the foregoing articles is incorporated herein by reference in its entirety.

With the deflection detectors illustrated in FIGS. 15A–15C, a feedback system similar to the one shown in FIG. 2 would be employed, but Wheatstone bridge 32 would be omitted, the output of the deflection detector being applied to feedback box 36. Without a piezoresistive deflection detector, correction units 34 and 35 would not be needed.

While several embodiments according to this invention have been described, it will be understood that numerous alternative embodiments will be apparent to those skilled in the art. For example, the principles of this invention are applicable to any kind of scanning probe microscope, including but not limited to magnetic and electric field microscopes. The broad scope of this invention, as defined in the following claims, is intended to cover all such embodiments.

We claim:

1. A scanning probe microscope comprising:
    a cantilever comprising an integral piezoelectric actuator and a piezoresistor; and
    a feedback system linking said piezoresistor and said piezoelectric actuator, said feedback system comprising a balance circuit connected to said piezoresistor and a lock-in amplifier connected to an output of said balance circuit, said balance circuit and said lock-in amplifier being connected to an output of an oscillator, an output of said lock-in amplifier representing a deflection of said cantilever and being used to drive said piezoelectric actuator.

2. The scanning probe microscope of claim 1 wherein said balance circuit comprises a transformer and a bridge circuit, said piezoresistor being connected in said bridge circuit.

3. The scanning probe microscope of claim 2 wherein said balance circuit further includes a differential amplifier, an output of said bridge circuit being connected to an input of said differential amplifier.

4. The scanning probe microscope of claim 1 wherein said feedback system further comprises a feedback box, said feedback box being connected between an output of said lock-in amplifier and said piezoelectric element.

5. The scanning probe microscope of claim 4 wherein an output of said feedback box is connected to a first electrode of said piezoelectric element, a second electrode of said piezoelectric element being connected to ground.

6. A method of analyzing the surface of a sample, said method comprising:
    providing a scanning probe microscope, said scanning probe microscope including a cantilever and a feedback system for controlling the distance between said cantilever and said surface;
    bringing a tip of said cantilever into a position adjacent said surface;
    scanning said surface with said tip at a rate in excess of 1 mm/second.

7. The method of claim 6 wherein said step of scanning comprises maintaining a constant force between said tip and said surface.

8. The method of claim 6 wherein said step of scanning comprises operating said scanning probe microscope in the intermittent contact mode.

9. The method of claim 6 wherein said step of scanning comprises scanning said surface with said tip at a rate in excess of 2 mm/second.

10. A method of bringing a cantilever of a scanning probe microscope into position to analyze a sample surface, said method comprising:
    incorporating an integral piezoelectric actuator and an integral piezoresistor in the cantilever;
    causing said cantilever to approach said sample surface;
    detecting when a tip of said scanning probe microscope is near said sample surface; and
    actuating said piezoelectric actuator so as to retract said tip a selected distance from said surface.

11. The method of claim 10 wherein the step of causing a cantilever to approach said sample surface is performed using a stepper motor.

12. The method of claim 10 wherein said step of detecting when said tip is near said sample surface is performed using said integral piezoresistor.

* * * * *

UNITED STATES PATENT AND TRADEMARK OFFICE
CERTIFICATE OF CORRECTION

PATENT NO. : 5,883,705
DATED : March 16, 1999
INVENTOR(S) : Minne, Stephen C.; Quate, Calvin F.; Manalis, Scott It is certified that error appears in the above-indentified patent and that said Letters Patent is hereby corrected as shown below:

Column 1, line 14, insert --

This invention was made with Government support under contract N00014-91-J-1050 awarded by the Department of the Navy ONR. The Government has certain rights in this invention.--

Signed and Sealed this

Ninth Day of November, 1999

Attest:

Q. TODD DICKINSON

Attesting Officer    Acting Commissioner of Patents and Trademarks